(12) United States Patent
Jang et al.

(10) Patent No.: US 10,330,861 B2
(45) Date of Patent: Jun. 25, 2019

(54) QUANTUM DOT UNIT, QUANTUM DOT SHEET HAVING THE SAME, AND DISPLAY DEVICE HAVING THE QUANTUM DOT UNIT OR THE QUANTUM DOT SHEET

(71) Applicant: SAMSUNG ELECTRONICS CO., LTD., Suwon-si (KR)

(72) Inventors: Nae-Won Jang, Seongnam-si (KR); Young Chol Lee, Hwaseong-si (KR); Byoung-Jin Cho, Anyang-si (KR); Seung Hun Chae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/715,341

(22) Filed: Sep. 26, 2017

(65) Prior Publication Data

US 2018/0095218 A1    Apr. 5, 2018

(30) Foreign Application Priority Data

Sep. 30, 2016 (KR) .................. 10-2016-0126563

(51) Int. Cl.
*G02B 6/02* (2006.01)
*H01L 33/50* (2010.01)
*F21V 8/00* (2006.01)

(52) U.S. Cl.
CPC ......... *G02B 6/0229* (2013.01); *G02B 6/0003* (2013.01); *G02B 6/0023* (2013.01);
(Continued)

(58) Field of Classification Search
CPC ............................ G02B 6/0229; G02B 6/0008
(Continued)

(56) References Cited

U.S. PATENT DOCUMENTS 9,594,209 B2 * 3/2017 Fan .................. G02B 6/0091
2008/0085086 A1    4/2008 Herz et al.
(Continued)

FOREIGN PATENT DOCUMENTS

CN        105158977 A     12/2015
KR     1020140017958 A     2/2014
WO      2016/110611 A1     7/2016

OTHER PUBLICATIONS

Communication dated Jan. 12, 2018 by the International Searching Authority in counterpart International Patent Application No. PCT/KR2017/010228. (PCT/ISA/210.
(Continued)

*Primary Examiner* — Igwe U Anya
(74) *Attorney, Agent, or Firm* — Sughrue Mion, PLLC

(57) ABSTRACT

Disclosed herein are a quantum dot unit having an improved structure for improving color reproducibility, a quantum dot sheet having the same, and a display device having the quantum dot unit or the quantum dot sheet. The display device includes a display panel configured to display an image, a light source provided to emit light to the display panel, a light guide plate provided to guide the light emitted from the light source to the display panel, and a quantum dot unit disposed between the light source and the light guide plate to change a wavelength of the light emitted from the light source and having ductility, wherein the quantum dot unit includes a glass fiber having a hollow portion and a quantum dot accommodated in the hollow portion.

20 Claims, 26 Drawing Sheets

(52) U.S. Cl.
CPC .......... *G02B 6/0096* (2013.01); *H01L 33/502* (2013.01); *G02B 2207/101* (2013.01)

(58) Field of Classification Search
USPC .......................................................... 257/88
See application file for complete search history.

(56) References Cited

U.S. PATENT DOCUMENTS

| | | | |
|---|---|---|---|
| 2012/0256163 A1 | 10/2012 | Yoon et al. | |
| 2014/0009959 A1* | 1/2014 | Park ................. | G02F 1/133615 362/559 |
| 2014/0313770 A1 | 10/2014 | Park et al. | |
| 2015/0038348 A1 | 2/2015 | Ashby et al. | |
| 2015/0214445 A1* | 7/2015 | Qiu ........................ | H01L 27/15 257/88 |
| 2015/0219821 A1* | 8/2015 | Seo ...................... | G02B 6/0088 362/608 |
| 2015/0219822 A1* | 8/2015 | Lee ...................... | G02B 6/0023 362/608 |
| 2015/0234111 A1 | 8/2015 | Lee et al. | |
| 2015/0293292 A1 | 10/2015 | Lee et al. | |
| 2016/0033711 A1* | 2/2016 | Lee ................... | G02F 1/133615 362/607 |
| 2016/0104825 A1 | 4/2016 | Sato | |
| 2016/0195229 A1* | 7/2016 | Tokinoya ................ | B32B 27/36 362/612 |
| 2016/0223739 A1 | 8/2016 | Yoon et al. | |
| 2017/0059760 A1* | 3/2017 | You ...................... | G02B 6/0003 |

OTHER PUBLICATIONS

Communication dated Mar. 5, 2018 by the European Patent Office in counterpart European Patent Application No. 17191886.5.
Communication dated Jul. 25, 2018, issued by the European Patent Office in counterpart European Application No. 17 191 886.5.

* cited by examiner

QUANTUM DOT UNIT, QUANTUM DOT SHEET HAVING THE SAME, AND DISPLAY DEVICE HAVING THE QUANTUM DOT UNIT OR THE QUANTUM DOT SHEET

CROSS-REFERENCE TO RELATED APPLICATION

This application claims the benefit of Korean Patent Application No. 10-2016-0126563, filed on Sep. 30, 2016 in the Korean Intellectual Property Office, the disclosure of which is incorporated herein by reference.

BACKGROUND

1. Field

Exemplary embodiments of the present disclosure relate to a quantum dot unit, a quantum dot sheet having the same, and a display device having the quantum dot unit or the quantum dot sheet, and more particularly, to a quantum dot unit having an improved structure for enhancing color reproducibility, a quantum dot sheet having the same, and a display device having the quantum dot unit or the quantum dot sheet.

2. Description of the Related Art

A display device is a kind of output device for visually displaying data information such as characters, figures, images, and the like.

The display device may include a self-emitting display panel such as an organic light-emitting diode (OLED) panel or a light receiving and emitting display panel such as a liquid crystal display (LCD) panel.

A display device to which the light-emitting and receiving display panel is applied may include a backlight unit (BLU) that supplies light to a display panel.

Recently, attempts have been made to increase color reproducibility of a display device by disposing a quantum dot unit at one side of a BLU. The quantum dot refers to a semiconductor crystal with a size on the order of nanometers (nm) produced by a chemical synthesis process. Here, the quantum dot emits shorter-wavelength light as its particle size is smaller, and emits longer-wavelength light as its particle size is larger.

When the quantum dot unit is applied to a display device, excellent color reproducibility can be realized with a low production cost. However, the quantum dot unit is vulnerable to oxygen or moisture and use of a barrier film for protecting the quantum dot unit from oxygen, moisture, and the like is inevitable. Generally, since the barrier film used in the quantum dot unit is expensive, it is difficult to provide a display device to consumers at a reasonable price.

SUMMARY

Therefore, it is an aspect of the present disclosure to provide a quantum dot unit having an improved structure for realizing excellent color reproducibility at a reasonable production cost, a quantum dot sheet having the same, and a display device having the quantum dot unit or the quantum dot sheet.

Additional aspects of the disclosure will be set forth in part in the description which follows and, in part, will become obvious from the description or may be learned by practicing the disclosure.

In accordance with one aspect of the present disclosure, a display device includes: a display panel configured to display an image; a light source configured to emit light to the display panel; a light guide plate configured to guide light emitted from the light source to the display panel; and a quantum dot unit disposed between the light source and the light guide plate and having ductility, wherein the quantum dot unit is configured to change a wavelength of the light emitted from the light source, and wherein the quantum dot unit includes a glass fiber having a hollow portion and a quantum dot accommodated in the hollow portion.

Here, the quantum dot unit may further include a protective membrane configured to surround an outer circumferential surface of the glass fiber.

Also, the protective membrane may include at least one of an acrylic resin, a silicone resin, and an epoxy resin.

Also, the light guide plate may include an incident surface on which the light emitted from the light source is incident, and the quantum dot unit may be disposed between the incident surface and the light source.

Also, the quantum dot unit may be spaced apart from each of the light guide plate and the light source.

Also, the quantum dot unit may include a plurality of quantum dot units arranged in a thickness direction of the light guide plate.

Also, the plurality of quantum dot units may be adhered to each other by an adhesive member.

Also, the adhesive member may be configured to surround a part of the plurality of quantum dots.

Also, the adhesive member may include at least one of an acrylic resin, a silicone resin, and an epoxy resin.

Also, the display device may further include: a printed circuit board (PCB) disposed behind the light guide plate in the thickness direction of the light guide plate, the light source being mounted on the PCB; a middle mold provided to support the display panel, wherein the middle mold includes an intermediate support portion disposed in front of the light guide plate in the thickness direction of the light guide plate to face the PCB with the light source interposed therebetween; and a fixing member including a first fixing member attached to the intermediate support portion such that a first quantum dot unit of the plurality of quantum dot units facing the intermediate support portion is fixed to the first fixing member, and a second fixing member attached to the PCB such that a second quantum dot unit of the plurality of quantum dot units facing the PCB is fixed to the second fixing member.

Also, the display device may further include: a PCB disposed behind the light guide plate in the thickness direction of the light guide plate, the light source being mounted on the PCB; and a middle mold provided to support the display panel, wherein the middle mold includes an intermediate support portion disposed in front of the light guide plate in the thickness direction of the light guide plate to face the PCB with the light source interposed therebetween, wherein at least one of the plurality of quantum dot units is fixed to at least one of the PCB and the intermediate support portion.

Also, the quantum dot unit may include a first quantum dot unit including a first quantum dot configured to emit light of a first color, and a plurality of second quantum dot units including a second quantum dot configured to emit light of a second color, the second color being different from the first color, the plurality of second quantum dot units being disposed along an outer periphery of the first quantum dot unit.

Also, the quantum dot unit may include a quantum dot sheet, wherein the quantum dot sheet may include plurality of quantum dot units.

In accordance with another aspect of the present disclosure, a display device includes: a display panel configured to display an image; a light source configured to emit light to the display panel; an optical sheet disposed in front of the light source to improve an optical characteristic of the light emitted from the light source; and a quantum dot sheet disposed adjacent to the optical sheet, the quantum dot sheet being configured to convert a wavelength of the light emitted from the light source to another wavelength, the quantum dot sheet including a quantum dot unit having ductility, wherein the quantum dot unit includes a glass fiber having a hollow portion and a quantum dot accommodated in the hollow portion.

Here, the quantum dot unit may further include a protective membrane configured to surround an outer circumferential surface of the glass fiber, and the protective membrane may include at least one of an acrylic resin, a silicone resin, and an epoxy resin.

Also, the display device may further include: a light diffusion plate disposed between the display panel and the light source, the light diffusion plate being configured to diffuse the light emitted from the light source and guide the diffused light to the display panel, wherein the quantum dot sheet is disposed between the optical sheet and the light diffusion plate.

In accordance with still another aspect of the present disclosure, a quantum dot unit includes: a tube-shaped glass fiber having ductility and a hollow portion; a quantum dot accommodated in the hollow portion; and a protective membrane configured to surround an outer circumferential surface of the glass fiber.

In accordance with yet another aspect of the present disclosure, a quantum dot sheet includes: a quantum dot containing layer, wherein the quantum dot containing layer contains a plurality of quantum dot units, each of the plurality of quantum dot units including a tube-shaped glass fiber having ductility and a hollow portion, a quantum dot accommodated in the hollow portion, and a protective membrane configured to surround an outer circumferential surface of the glass fiber.

Here, the quantum dot sheet may further include a protective layer stacked on at least one surface of the quantum dot containing layer, wherein the protective layer includes polyethylene terephthalate (PET).

In accordance with yet another aspect of the present disclosure, a quantum dot sheet includes: a display panel configured to display an image; a light source configured to emit light to the display panel; and a light guide plate configured to guide the light emitted from the light source to the display panel, wherein the light guide plate includes a quantum dot unit having ductility, the quantum dot unit being configured to change a wavelength of the light emitted from the light source, and wherein the quantum dot unit includes a glass fiber having a hollow portion and a quantum dot accommodated in the hollow portion.

BRIEF DESCRIPTION OF THE DRAWINGS

These and/or other aspects of the disclosure will become apparent and more readily appreciated from the following description of the exemplary embodiments, taken in conjunction with the accompanying drawings, of which.

Figure 13:
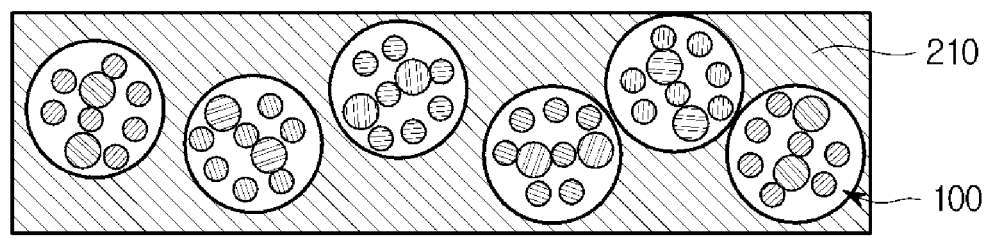
FIG. 13 is a view showing a quantum dot sheet according to the first embodiment that can be applied to a display device according to an exemplary embodiment.
Figure 21:
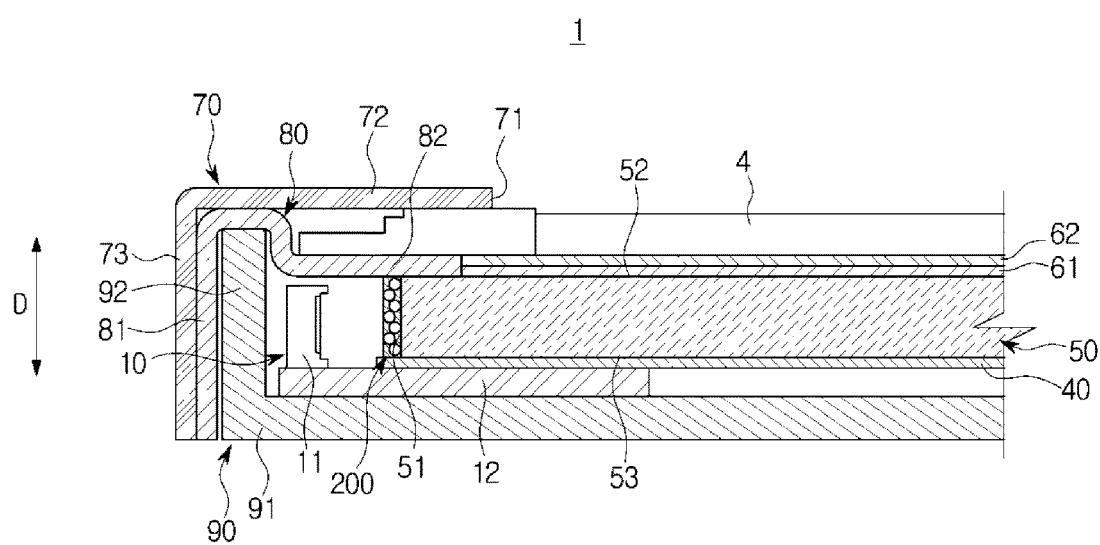
Figure 22:
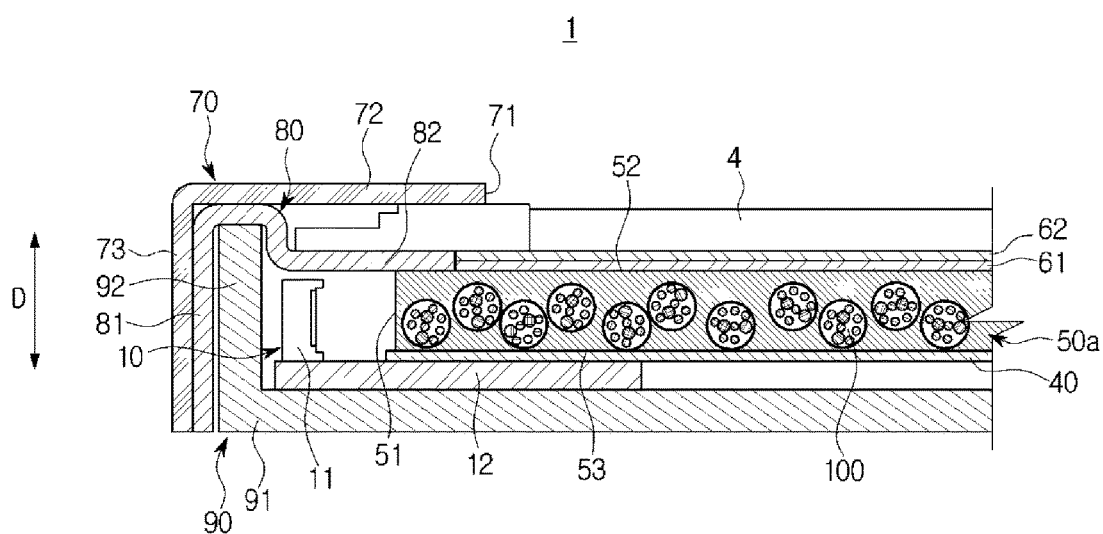
Figure 23:
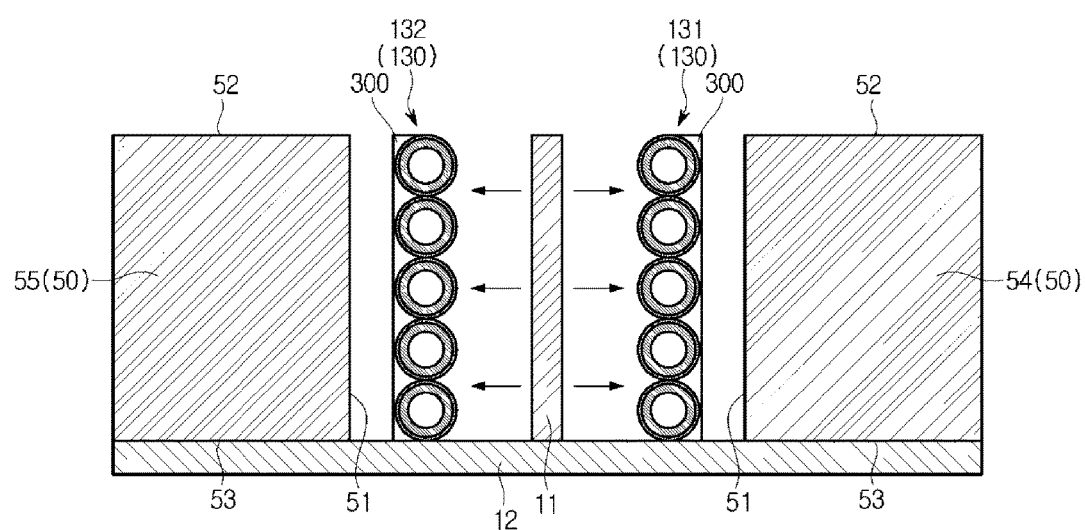
Figure 24:
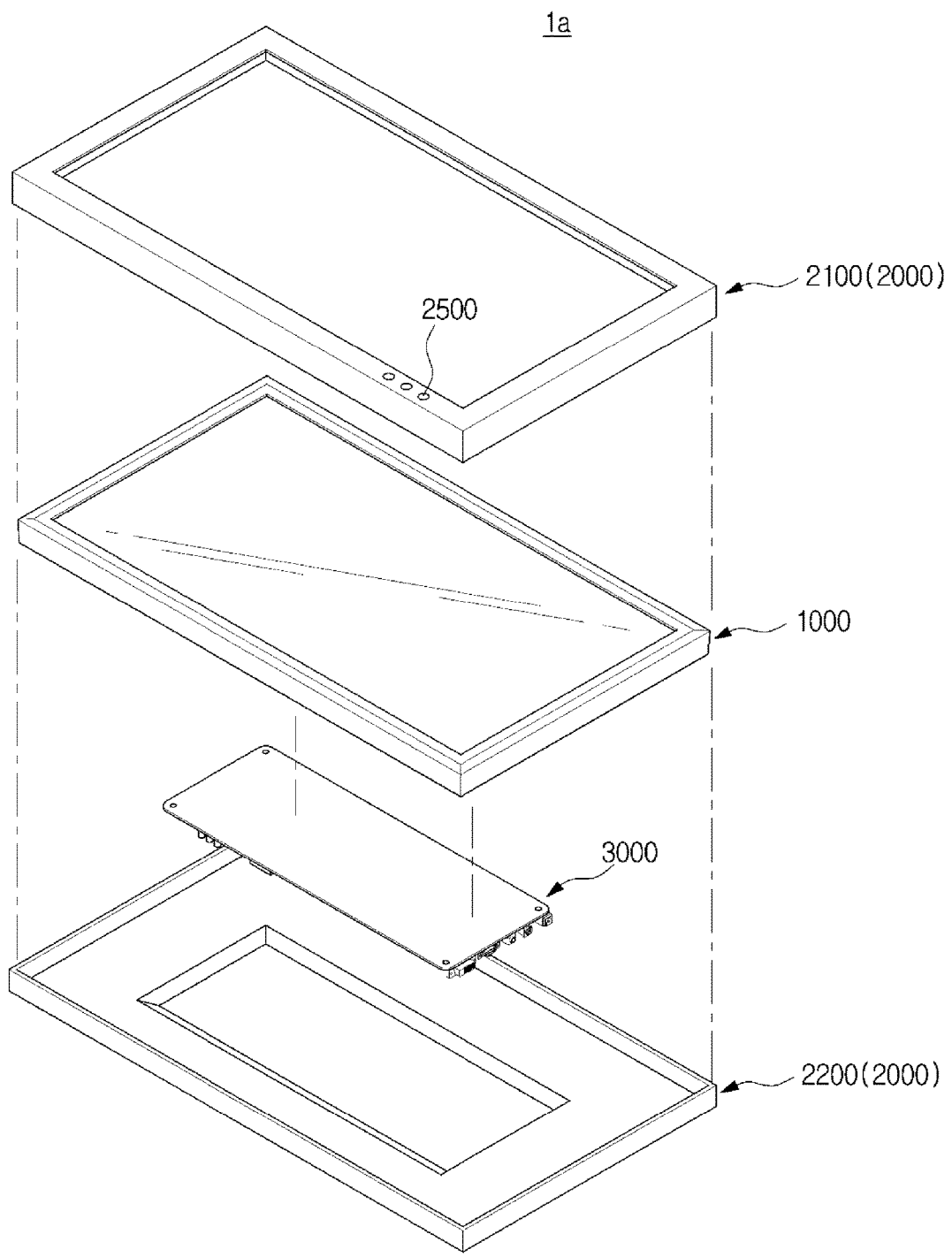
Figure 25:
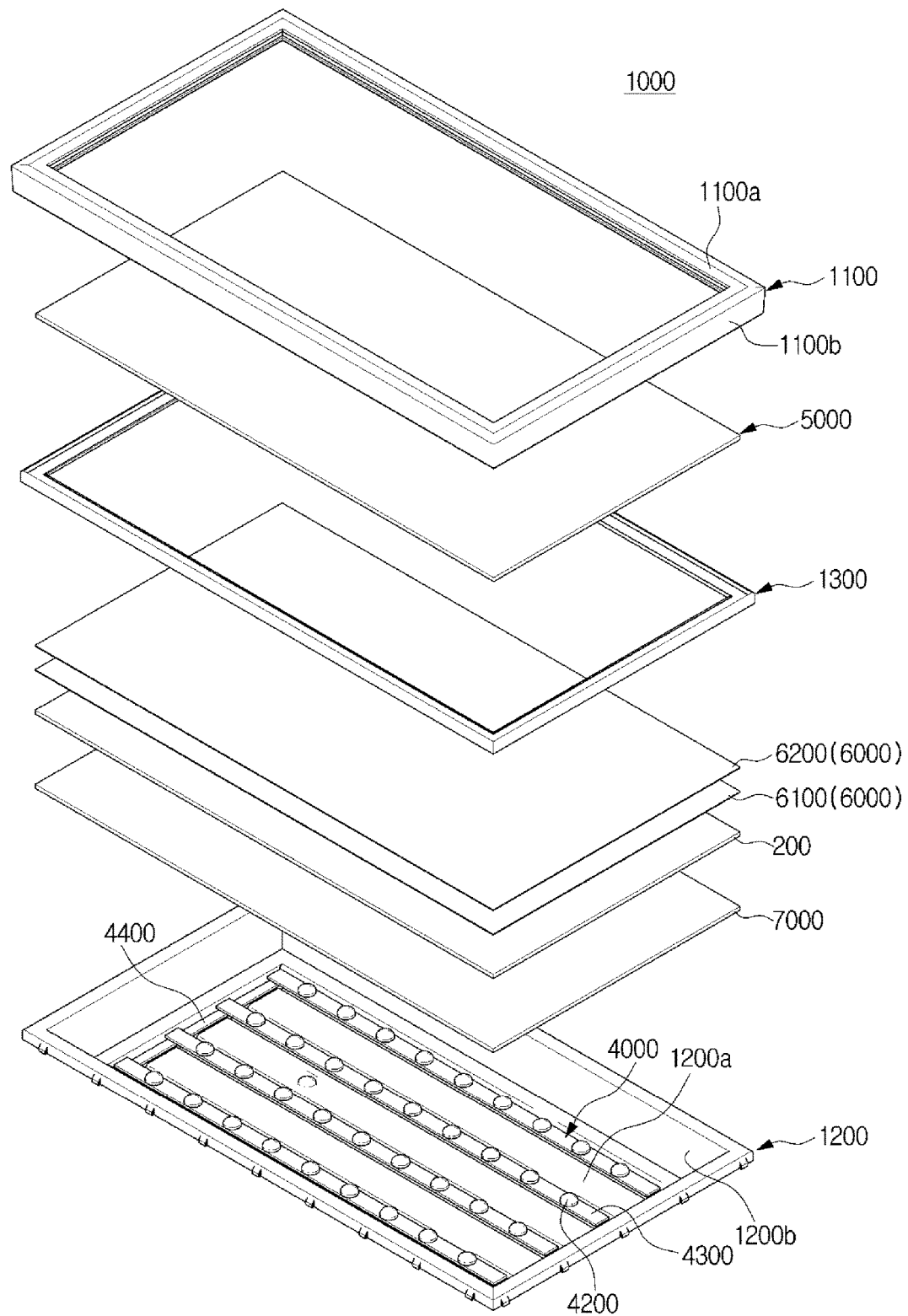
Figure 26:
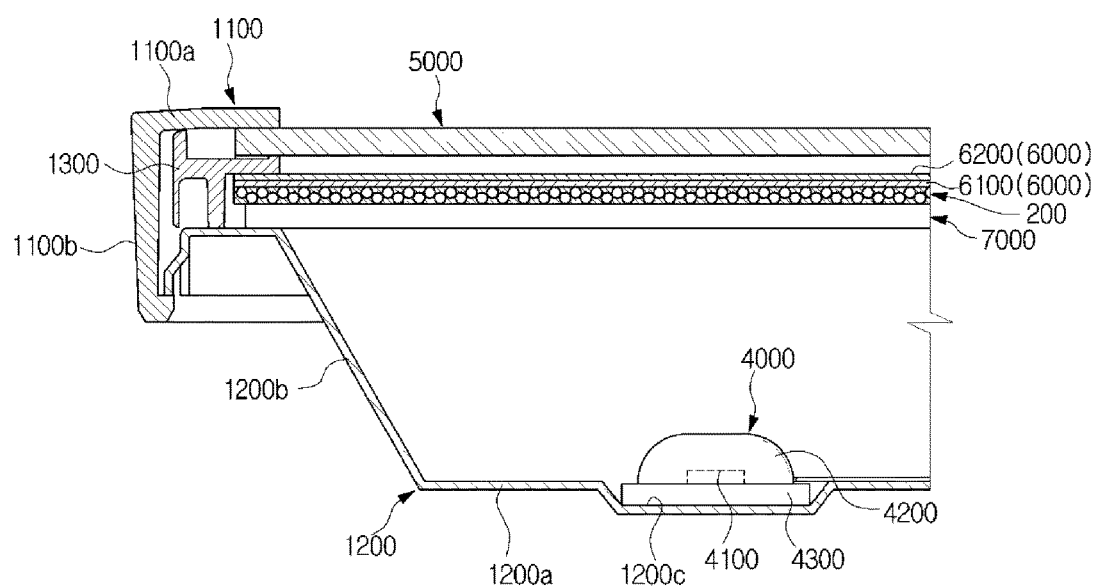

13 is disposed behind a light guide plate in a display device according to an exemplary embodiment;

FIG. 21 is a view showing a structure in which the quantum dot sheet according to the first embodiment of FIG. 13 is disposed on a lateral side of a light guide plate in a display device according to an exemplary embodiment;

FIG. 22 is a cross-sectional view showing a display device according to another exemplary embodiment;

FIG. 23 is a cross-sectional view showing a display device according to still another exemplary embodiment;

FIG. 24 is an exploded perspective view showing a display device according to yet another exemplary embodiment;

FIG. 25 is an exploded perspective view of a display module in the display device of FIG. 24; and FIG. 26 is a cross-sectional view of the display module in the display device of FIG. 24.

DETAILED DESCRIPTION

Hereinafter, exemplary embodiments of the present disclosure will be described in detail with reference to the accompanying drawings. Meanwhile, terms "front end," "rear end," "above," "below," "upper end," "lower end," and the like used in the following description are defined on the basis of the drawings, and the shape and position of each component are not limited by these terms.

Figure 1:
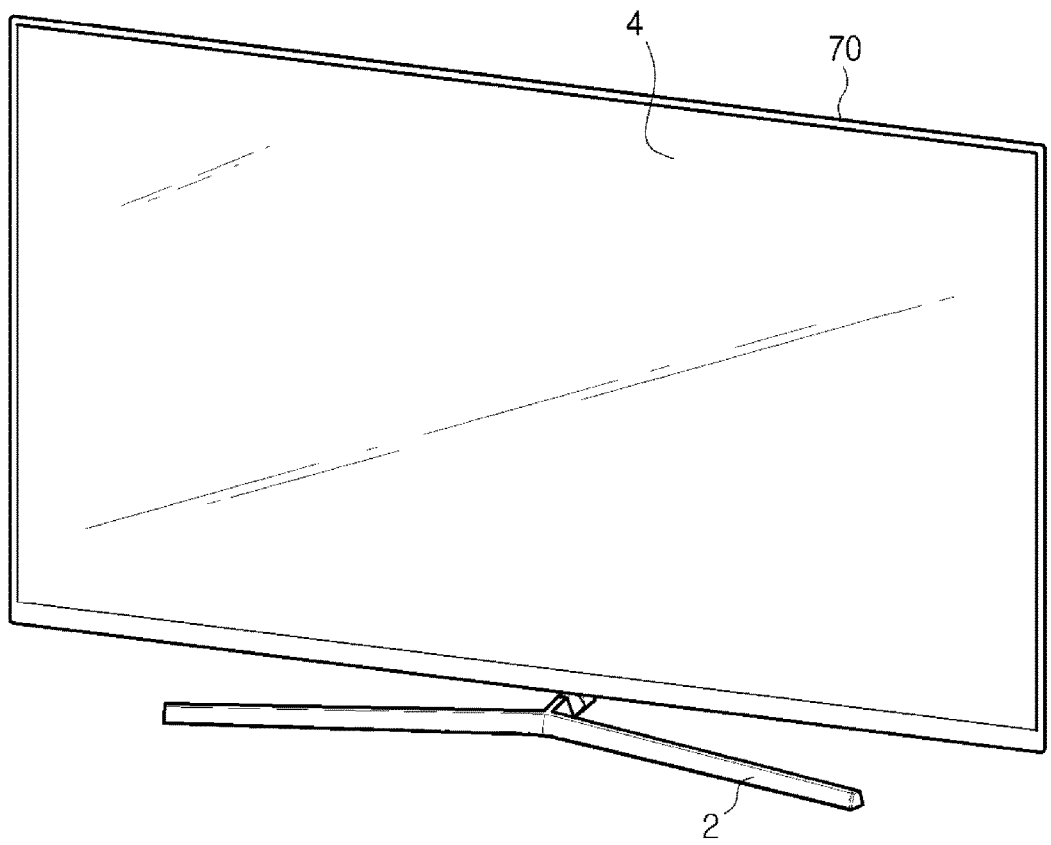
FIG. 1 is a view showing a display device according to an exemplary embodiment.
Figure 2:
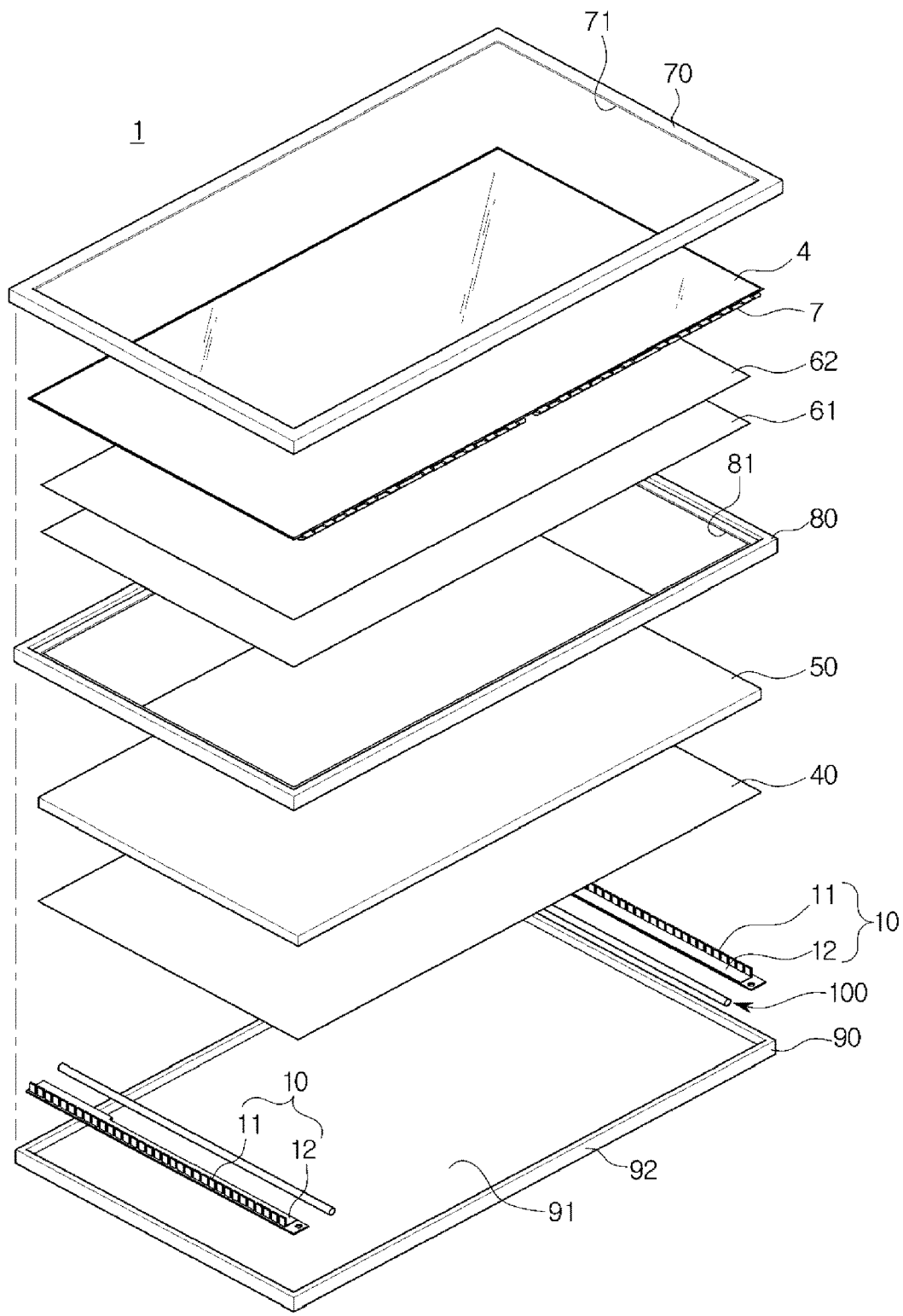
FIG. 2 is an exploded perspective view showing a display device according to an exemplary embodiment.

FIG. 1 is a view showing a display device according to an exemplary embodiment, and FIG. 2 is an exploded perspective view showing a display device according to an exemplary embodiment.

A display device 1 is a device for displaying information, data, etc. in the form of characters, figures, graphs, images, etc., and includes a television, which is a telecommunication medium for receiving moving images and video signals, and a monitor, which is a kind of computer output device.

The display device 1 may be a flat display device whose screen is flat, as shown in FIG. 1, a curved display device whose screen is curved, or a bendable display device whose screen changes from a flat surface to a curved surface and from the curved surface to the flat surface or in which a curvature of the curved surface is variable.

The display device 1 may include a display panel 4 for displaying an image as a display unit of the display device 1, and a backlight unit (BLU) for illuminating the display panel 4 with light.

The display panel 4 may include a liquid crystal panel. The liquid crystal panel may display an image using liquid crystals that exhibit optical properties according to changes in voltage and temperature. The liquid crystal panel may include thin film transistor (TFT) substrate, a color filter substrate coupled to the TFT substrate to face the TFT, and liquid crystals injected between the TFT substrate and the color filter substrate. The TFT substrate may be a transparent substrate in which TFTs are formed in a matrix to operate as a switching element, and the color filter substrate may be a transparent substrate in which RGB color pixels, which are color pixels expressing a predetermined color, are formed by a thin film process.

As shown in FIG. 2, a signal reception film 7 for receiving a data driving signal and a gate driving signal may be connected to the display panel 4. The signal transmission film 7 may be formed as a chip on flexible printed circuit (COF) in which a driving chip is mounted on a flexible circuit board.

The BLU may be disposed behind the display panel 4 to illuminate a side of the display panel 4 with light.

The BLU may be an edge type BLU in which a light source 11 is disposed on at least one side among a plurality of long sides and a plurality of short sides of the display panel 4, as in the present embodiment, or may be a direct type BLU in which the light source 11 is disposed directly behind the display panel 4.

As shown in FIG. 2, the BLU may include a light source module 10 composed of the light source 11, a printed circuit board (PCB) 12 on which the light source 11 is mounted, and various optical members disposed on a propagation path of light emitted from the light source 11.

The light source 11 may include a light emitting diode (LED). The LED may be provided as a package in which an LED chip is mounted on a substrate and a resin is filled in the package. However, a cold cathode fluorescent lamp (CCFL) or an external electrode fluorescent lamp (EEFL) may be used as the light source.

A plurality of light sources 11 may be mounted on the PCB 12 in a line along an edge of the display panel 4. A circuit pattern or the like for transmitting driving power and signals to the light source 11 may be formed on the PCB 12. The PCB 12 can be seated on a rear chassis 90, which will be described later.

The optical member may be disposed on the propagation path of the light emitted from the light source 11 to guide a traveling direction of the light or improve optical characteristics.

As shown in FIG. 2, the optical member may include a reflective sheet 40 for reflecting light and preventing a light loss, a light guide plate 50 for uniformly dispersing the light emitted from the light source 11 toward the display panel 4, and various optical sheets 61 and 62 for improving the optical characteristics.

The reflective sheet 40 may reflect the light emitted from the light source 11 and cause the reflected light to be incident on a rear surface of the light guide plate 50. The reflective sheet 40 may be formed in various shapes such as a sheet shape, a film shape, a plate shape, and the like. As an example, the reflective sheet 40 may be formed by coating a base material with a material having high reflectance. As the base material, stainless steel (SUS), brass, aluminum, polyethylene terephthalate (PET), or the like may be used, and as a high reflective coating agent, silver, $TiO_2$, or the like may be used.

The reflective sheet 40 may be seated on and supported by the PCB 12.

The light guide plate 50 may be made with poly (methyl methacrylate) (PMMA). The light guide plate 50 may be provided with a pattern for changing a path of light. In an edge type BLU, as in the present embodiment, the light source 11 may be positioned on a side surface of the light guide plate 50. Light incident on the side surface of the light guide plate 50 may be scattered in a pattern formed on the rear surface of the light guide plate 50 and may be emitted through a front surface of the light guide plate 50.

The light guide plate 50 may be seated on the reflective sheet 40. The light guide plate 50 may be disposed such that the side surface of the light guide plate 50 is spaced apart from the light source 11 by a predetermined distance in consideration of thermal expansion.

The optical sheets 61 and 62 may be disposed in front of the light guide plate 50 to improve optical characteristics of the light emitted from the light guide plate 50.

The optical sheets 61 and 62 may include a diffuser sheet 61 and a prism sheet 62.

The diffuser sheet 61 can cancel or minimize the pattern of the light guide plate 50. Since light guided through the light guide plate 50 directly enters the eyes of a user, the pattern of the light guide plate 50 is directly reflected on the eyes, and so the diffuser sheet 61 cancels or minimizes the pattern of the light guide plate 50.

The prism sheet 62 may enhance brightness of light by concentrating light whose brightness suddenly falls while passing through the diffuser sheet 61. A dual brightness enhancement film (DBEF) sheet, which is a high brightness prism sheet, or the like may be used as the prism sheet 62.

However, the optical sheet may further include a protection sheet for protecting the optical sheet from external shocks or a foreign substance inflow.

The optical sheets 61 and 62 may be disposed between the light guide plate 50 and the display panel 4.

The optical member may further include quantum dot units 100, 110, 120, 130, 140, and 150.

The quantum dot units 100, 110, 120, 130, 140, and 150 may change a wavelength of light to improve color reproducibility. Color reproducibility is a measure for determining how close a corresponding light is to a natural color and for determining how large an area of color space the corresponding light can express in color coordinates.

Figure 3:
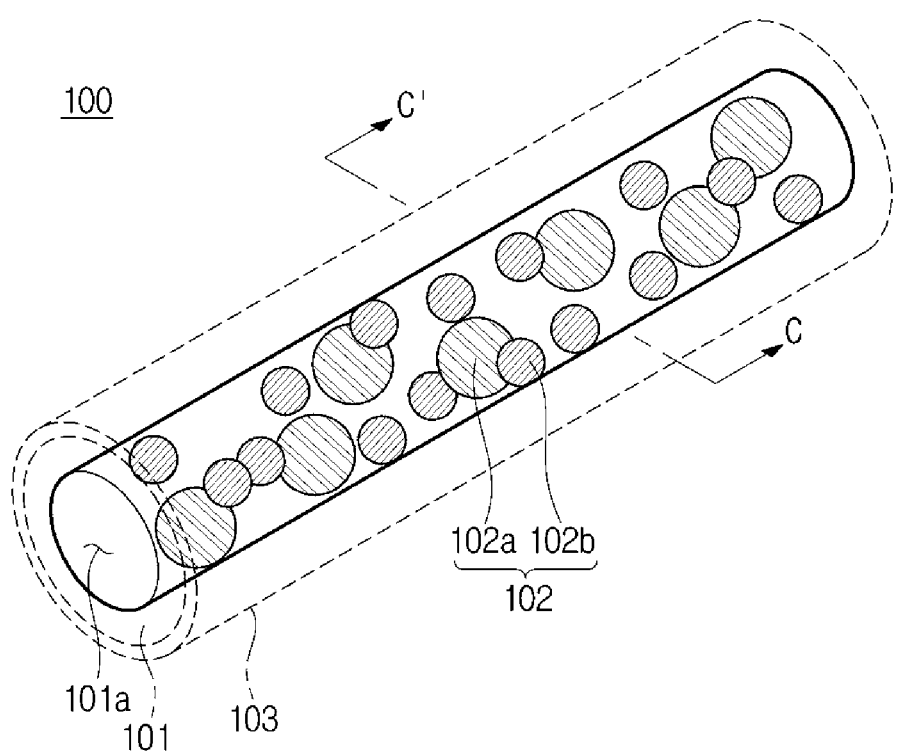
FIG. 3 is a view showing a quantum dot unit according to a first embodiment that can be applied to a display device according to an exemplary embodiment.

As shown in FIG. 3, for example, the quantum dot units 100, 110, 120, 130, 140, and 150 may include quantum dots 102. The quantum dots 102 may receive blue light and generate all colors of visible light according to sizes thereof. Light with a shorter wavelength is generated as the size of the quantum dot is smaller, and light with a longer wavelength is generated as the size of the quantum dot is larger.

The quantum dot units 100, 110, 120, 130, 140, and 150 will be described in detail later.

The display device 1 may further include a chassis assembly for receiving and supporting the display panel 4 and the BLU.

The chassis assembly may be composed of a front chassis 70, a middle mold 80, and the rear chassis 90.

The front chassis 70 may include an opening 71 for exposing the display panel 4, a bezel portion 72 for supporting a front surface edge portion of the display panel 4, and a front chassis side portion 73 extending rearward from the bezel portion 72.

The middle mold 80 may include a middle mold side portion 81 and an intermediate support portion 82 that protrudes inward from the middle mold side portion 81 to support the display panel 4 and the optical member and to maintain an interval therebetween.

The rear chassis 90 may include a rear portion 91 disposed behind the BLU and a rear side portion 92 extending upward from the rear portion 91. The PCB 12 of the light source module 10 may be seated on the rear portion 91.

Various components of the display device 1 such as the front chassis 70, the middle mold 80, etc., may be fixed and supported on the rear chassis 90.

The rear chassis 90 may radiate heat generated by the light source 11 to the outside. That is, heat generated by the light source 11 may be transmitted to the rear chassis 90 via the PCB 12 and may be radiated from the rear chassis 90. For this purpose, the rear chassis 90 may be made with various metal materials which have good thermal conductivity such as aluminum, SUS, and the like, or a plastic material such as acrylonitrile butadiene styrene (ABS). Also, a metal PCB made with an aluminum material having good thermal conductivity may be used as the PCB 12.

However, at least one of the front chassis 70, the middle mold 80, and the rear chassis 90 may be omitted, or the chassis may be integrally formed.

The display device 1 may further include a housing (not shown) that encloses the chassis assembly to protect and accommodate such a chassis assembly.

The display device 1 may further include a leg 2 for supporting the display device 1 on a mounting surface. The display device 1 may be supported on a floor surface as shown in FIG. 1. Also, the display device 1 may be provided to be hung on a wall, or may be provided inside a wall via a built-in method.

FIG. 3 is a view showing a quantum dot unit according to a first embodiment that can be applied to a display device according to an exemplary embodiment.

As shown in FIG. 3, a quantum dot unit 100 may have ductility.

Figure 5:
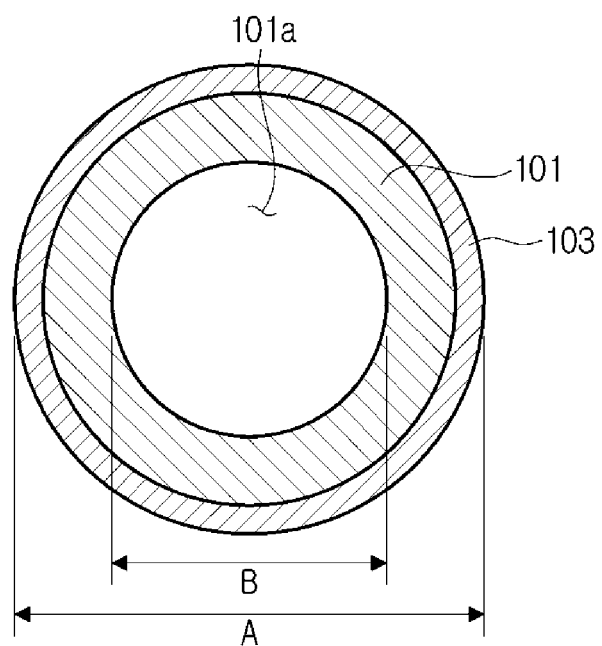
FIG. 5 is a cross-sectional view of the quantum dot unit according to the first embodiment of FIG. 3 taken along C-C'.

The quantum dot unit 100 may include a glass fiber 101. The glass fiber 101 may have a hollow portion 101a. Specifically, the glass fiber 101 may have a tube shape having the hollow portion 101a. As shown in FIGS. 3 and 5, a cross section of the glass fiber 101 may be a circle, but the shape of the cross section of the glass fiber 101 is not limited to the circle.

The quantum dot unit 100 may further include quantum dots 102 accommodated in the hollow portion 101a. The quantum dots 102 may include various quantum dots that generate various colors. As an example, the quantum dots 102 may include a first quantum dot 102a for generating red light and a second quantum dot 102b for generating green light. As shown in FIG. 3, the first quantum dot 102a and the second quantum dot 102b may be accommodated in the hollow portion 101a of the glass fiber 101.

The quantum dot unit 100 may further include a protective membrane 103 provided to surround an outer circumferential surface of the glass fiber 101. The protective membrane 103 may include at least one of an acrylic resin, a silicone resin, and an epoxy resin.

The quantum dots 102 are vulnerable to moisture or oxygen. When the quantum dots 102 react with moisture or oxygen, optical characteristics of the quantum dots 102 may change. The glass fiber 101 blocks moisture or oxygen and prevents the optical characteristics of the quantum dots 102 from being changed. The protective membrane 103 also prevents moisture or oxygen from reacting with the quantum dots 102 together with the glass fiber 101. In addition, the protective membrane 103 serves to prevent cracking of the glass fiber 101 when the quantum dot unit 100 is deformed.

Figure 4:
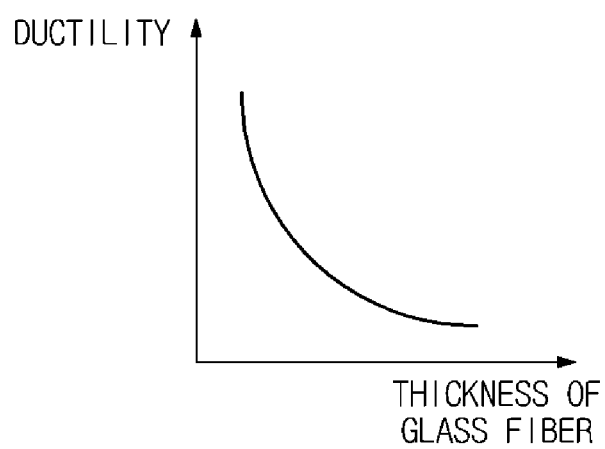
FIG. 4 is a graph showing a relationship between a diameter of a glass fiber and ductility of the glass fiber in the quantum dot unit according to the first embodiment of FIG. 3.

FIG. 4 is a graph showing a relationship between a diameter of a glass fiber and ductility of the glass fiber in the quantum dot unit according to the first embodiment of FIG. 3.

As shown in FIG. 4, thickness and ductility of the glass fiber 101 are inversely proportional to each other. That is, as the thickness of the glass fiber 101 increases, the ductility of the glass fiber 101 deteriorates. On the other hand, as the thickness of the glass fiber 101 decreases, the ductility of the glass fiber 101 improves. Here, the thickness of the glass fiber 101 refers to the diameter of the glass fiber 101 under the assumption that the cross-sectional shape of the glass fiber 101 is a circle. Preferably, the diameter of the glass fiber 101 may be 100 μm or more and 1,000 μm or less.

Figure 6:
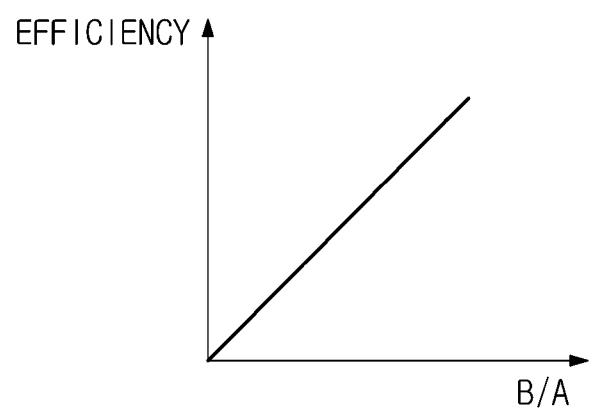
FIG. 6 is a graph showing a relationship, in the quantum dot unit according to the first embodiment of FIG. 5, between a ratio B/A of a hollow diameter B of a glass fiber to a diameter A of the quantum dot unit and efficiency of the quantum dot unit.
Figure 7:
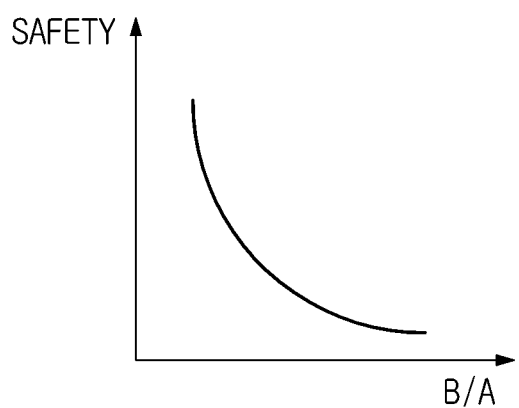
FIG. 7 is a graph showing a relationship, in the quantum dot unit according to the first embodiment of FIG. 5, between the ratio B/A of the hollow diameter B of the glass fiber to the diameter A of the quantum dot unit and safety of the quantum dot unit.

FIG. 5 is a cross-sectional view of the quantum dot unit according to the first embodiment of FIG. 3 taken along C-C', FIG. 6 is a graph showing a relationship between a ratio B/A of a hollow diameter B of a glass fiber in the quantum dot unit according to the first embodiment of FIG. 5 to a diameter A of the quantum dot unit and efficiency of the quantum dot unit, and FIG. 7 is a graph showing a relationship between the ratio B/A of the hollow diameter B of the glass fiber in the quantum dot unit according to the first embodiment of FIG. 5 to the diameter A of the quantum dot unit and safety of the quantum dot unit.

As shown in FIGS. 5 to 7, under the assumption that the cross-sectional shape of the glass fiber 101 is a circle, a relationship between the ratio B/A of a diameter B of the hollow portion 101a of the glass fiber 101 to the diameter A of the quantum dot unit 100 including the protective membrane 103 and efficiency of the quantum dot unit 100 and a relationship between the ratio B/A of the diameter B of the hollow portion 101a of the glass fiber 101 to the diameter A of the quantum dot unit 100 including the protective membrane 103 and safety of the quantum dot unit 100 are as follows. Here, the efficiency of the quantum dot unit 100 refers to optical efficiency of the quantum dot unit 100, that is, color reproducibility of the quantum dot unit 100. In addition, the safety of the quantum dot unit 100 refers to a possibility of damage to the quantum dot unit 100.

As can be seen from the graph of FIG. 6, the ratio B/A of the diameter B of the hollow portion 101a of the glass fiber 101 to the diameter A of the quantum dot unit 100 and the efficiency of the quantum dot unit 100 are proportional to each other. In other words, as the ratio B/A of the diameter B of the hollow portion 101a of the glass fiber 101 to the diameter A of the quantum dot unit 100 increases, the efficiency of the quantum dot unit 100 increases. On the other hand, as the ratio B/A of the diameter B of the hollow portion 101a of the glass fiber 101 to the diameter A of the quantum dot unit 100 decreases, the efficiency of the quantum dot unit 100 decreases.

As can be seen from the graph of FIG. 7, the ratio B/A of the diameter B of the hollow portion 101a of the glass fiber 101 to the diameter A of the quantum dot unit 100 and the safety of the quantum dot unit 100 are inversely proportional to each other. That is, as the ratio B/A of the diameter B of the hollow portion 101a of the glass fiber 101 to the diameter A of the quantum dot unit 100 increases, the safety of the quantum dot unit 100 decreases. In other words, as the ratio B/A of the diameter B of the hollow portion 101a of the glass fiber 101 to the diameter A of the quantum dot unit 100 increases, the possibility of damage to the quantum dot unit 100 increases. On the other hand, as the ratio B/A of the diameter B of the hollow portion 101a of the glass fiber 101 to the diameter A of the quantum dot unit 100 decreases, the safety of the quantum dot unit 100 increases. In other words, as the ratio B/A of the diameter B of the hollow portion 101a of the glass fiber 101 to the diameter A of the quantum dot unit 100 decreases, the possibility of damage to the quantum dot unit 100 decreases.

In this manner, as the ratio B/A of the diameter B of the hollow portion 101a of the glass fiber 101 to the diameter A of the quantum dot unit 100 increases, the efficiency of the quantum dot unit 100 increases, but the safety of the quantum dot unit 100 decreases and so the ratio B/A of the diameter B of the hollow portion 101a of the glass fiber 101 to the diameter A of the quantum dot unit 100 may act as an important factor for securing both the efficiency of the quantum dot unit 100 and the safety of the quantum dot unit 100. Preferably, the ratio B/A of the diameter B of the hollow portion 101a of the glass fiber 101 to the diameter A of the quantum dot unit 100 may be 0.5 or larger and 0.95 or smaller.

Figure 8:
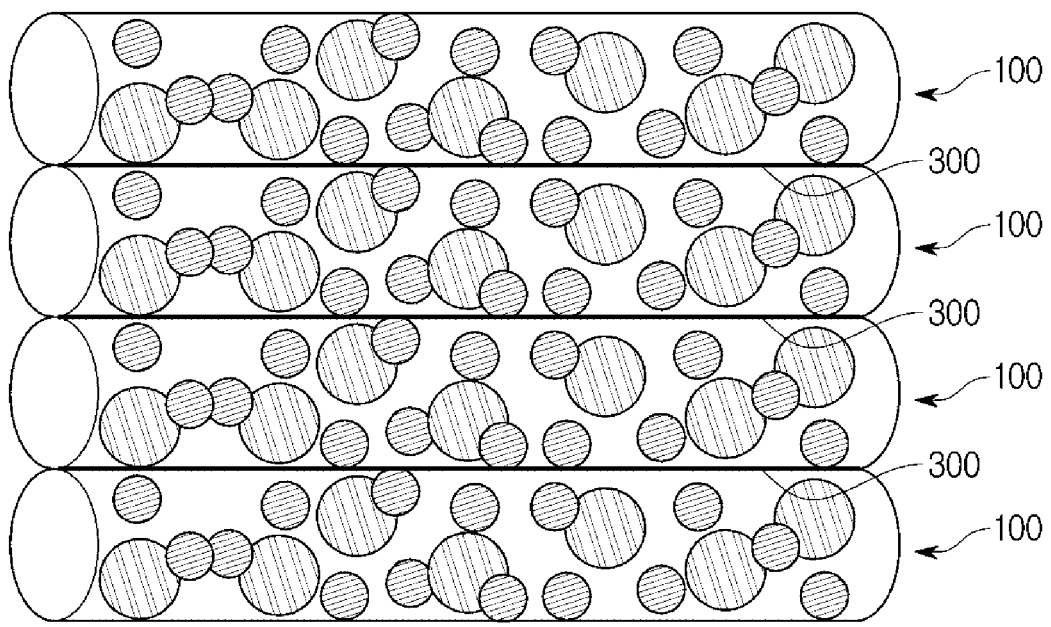
FIG. 8 is a view showing a quantum dot unit according to a second embodiment that can be applied to a display device according to an exemplary embodiment.

FIG. 8 is a view showing a quantum dot unit according to a second embodiment that can be applied to a display device according to an exemplary embodiment.

As shown in FIG. 8, a quantum dot unit 110 may include a plurality of stacked and arranged quantum dot units 100. In other words, the quantum dot unit 110 according to the second embodiment may include the plurality of stacked and arranged quantum dot units 100 according to the first embodiment.

The quantum dot unit 110 according to the second embodiment may further include an adhesive member 300. The adhesive member 300 may allow the quantum dot units 100 according to the first embodiment to be adhered to each other. The adhesive member 300 may include at least one of an acrylic resin, a silicone resin, and an epoxy resin.

As shown in FIG. 8, the adhesive member 300 may be positioned between the plurality of adjacent quantum dot units 100 according to the first embodiment. Specifically, the adhesive member 300 may be positioned on contact surfaces of the plurality of adjacent quantum dot unit 100 according to the first embodiment. As an example, when a first quantum dot unit and a second quantum dot unit are stacked and arranged as shown in FIG. 8, the adhesive member 300 may be positioned between contact surfaces of the first quantum dot unit and the second quantum dot unit.

Figure 9:
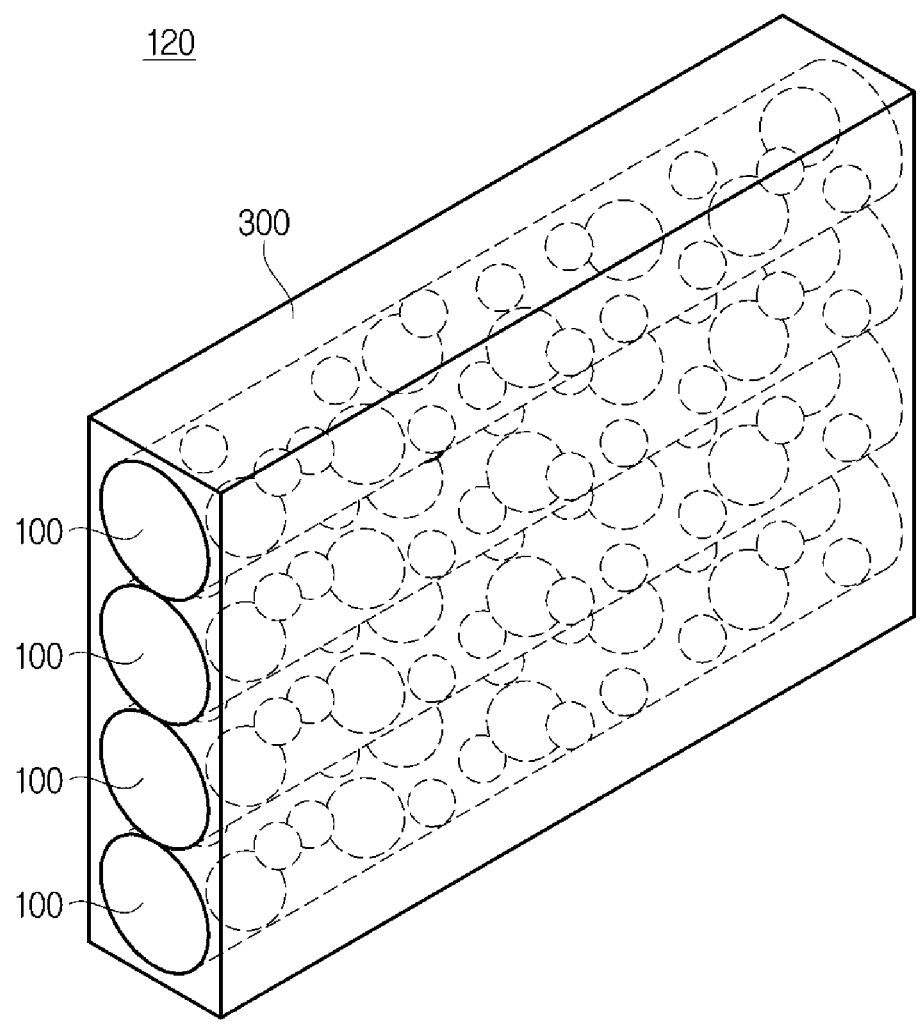
FIG. 9 is a view showing a quantum dot unit according to a third embodiment that can be applied to a display device according to an exemplary embodiment.

FIG. 9 is a view showing a quantum dot unit according to a third embodiment that can be applied to a display device according to an exemplary embodiment.

As shown in FIG. 9, a quantum dot unit 120 according to the third embodiment may include a plurality of stacked and arranged quantum dot units 100 according to the first embodiment.

The quantum dot unit 120 according to the third embodiment may further include an adhesive member 300. The adhesive member 300 may allow the plurality of quantum dot units 100 according to the first embodiment to be adhered to each other. The adhesive member 300 may include at least one of an acrylic resin, a silicone resin, and an epoxy resin.

As shown in FIG. 9, the adhesive member 300 may surround the plurality of stacked and arranged quantum dot units 100 according to the first embodiment. In other words, the adhesive member 300 may surround all outer circumferential surfaces of the plurality of stacked and arranged quantum dot units 100 according to the first embodiment.

Figure 10:
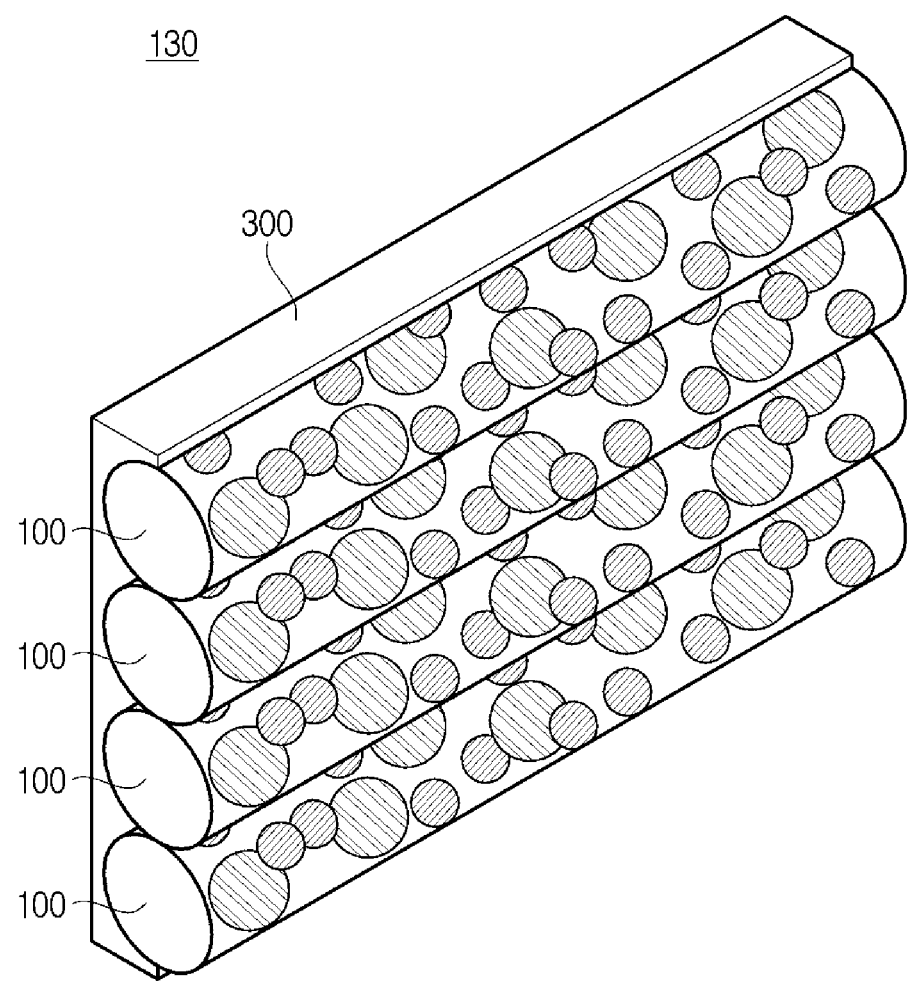
FIG. 10 is a view showing a quantum dot unit according to a fourth embodiment that can be applied to a display device according to an exemplary embodiment.

FIG. 10 is a view showing a quantum dot unit according to a fourth embodiment that can be applied to a display device according to an exemplary embodiment.

As shown in FIG. 10, a quantum dot unit 130 according to the fourth embodiment may include the plurality of stacked and arranged quantum dot units 100 according to the first embodiment.

The quantum dot unit 130 according to the fourth embodiment may further include an adhesive member 300. The adhesive member 300 may allow the plurality of quantum dot units 100 according to the first embodiment to be adhered to each other. The adhesive member 300 may include at least one of an acrylic resin, a silicone resin, and an epoxy resin.

As shown in FIG. 10, the adhesive member 300 may surround a part of the plurality of stacked and arranged quantum dot units 100 according to the first embodiment. In other words, the adhesive member 300 may surround a part of outer circumferential surfaces of the plurality of stacked and arranged quantum dot units 100 according to the first embodiment.

Figure 11:
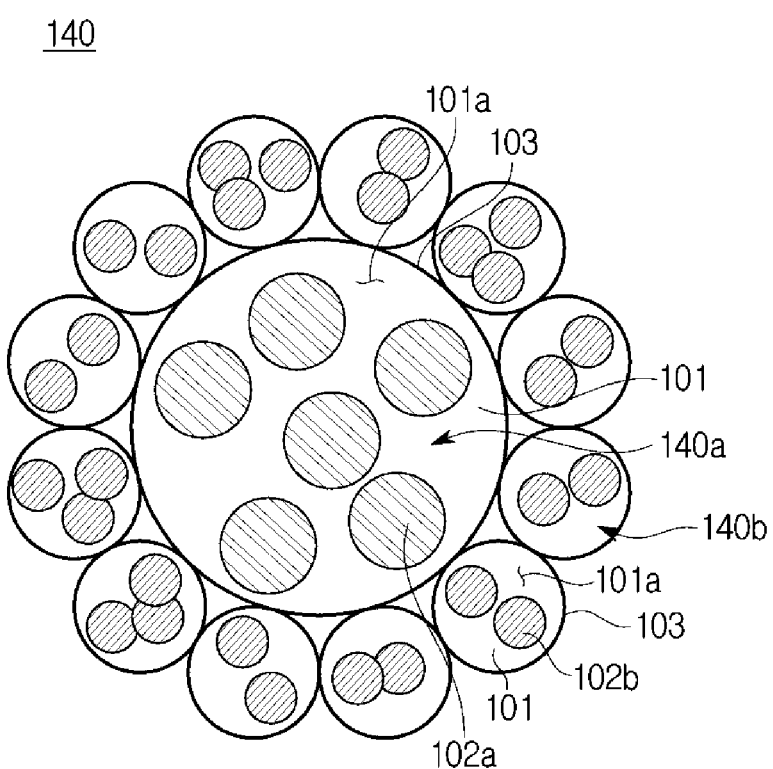
FIG. 11 is a view showing a quantum dot unit according to a fifth embodiment that can be applied to a display device according to an exemplary embodiment.

FIG. 11 is a view showing a quantum dot unit according to a fifth embodiment that can be applied to a display device according to an exemplary embodiment.

As shown in FIG. 11, a quantum dot unit 140 according to the fifth embodiment may include a first quantum dot unit 140a. The first quantum dot unit 140a may have ductility.

The first quantum dot unit 140a may include a glass fiber 101 having a hollow portion 101a and a first quantum dot 102a accommodated in the hollow portion 101a. In addition, the first quantum dot unit 140a may further include a protective membrane 103 provided to surround an outer circumferential surface of the glass fiber 101.

The quantum dot unit 140 according to the fifth embodiment may further include a plurality of second quantum dot units 140b. The plurality of second quantum dot units 140b may be arranged along an outer periphery of the first quantum dot unit 140a. Each of the plurality of second quantum dot unit 140b has ductility. Each of the plurality of quantum dot units 140b may include the glass fiber 101 having the hollow portion 101a and the second quantum dot 102b accommodated in the hollow portion 101a. The second quantum dot 102b may generate a different color from the first quantum dot 102a. In addition, each of the plurality of second quantum dot units 140b may further include the protective membrane 103 provided to surround the outer circumferential surface of the glass fiber 101.

A diameter of the first quantum dot unit 140a may be larger than a diameter of each of the second quantum dot units 140b.

The diameters of the plurality of second quantum dot units 140b may be the same.

Alternatively, a diameter of at least one of the plurality of second quantum dot units 140b may be different.

Preferably, the first quantum dot 102a may generate a red color and the second quantum dot 102b may generate a green color. Preferably, the number of second quantum dots 102b may be larger than the number of first quantum dots 102a.

The quantum dot unit 140 according to the fifth embodiment may further include an adhesive member 300. The adhesive member 300 may allow the first quantum dot unit 140a and the plurality of second quantum dot units 140b to be adhered to each other. In addition, the adhesive member 300 may allow the plurality of second quantum dot units 140b to be adhered to each other. The adhesive member 300 may include at least one of an acrylic resin, a silicone resin, and an epoxy resin.

Figure 12:
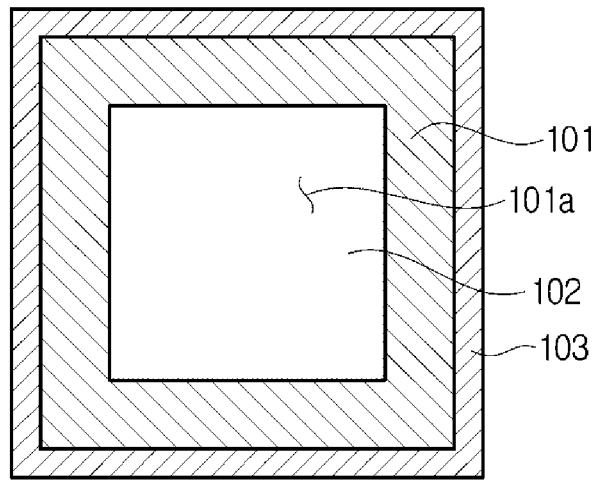
FIG. 12 is a view showing a quantum dot unit according to a sixth embodiment that can be applied to a display device according to an exemplary embodiment.

FIG. 12 is a view showing a quantum dot unit according to a sixth embodiment that can be applied to a display device according to an exemplary embodiment. Hereinafter, descriptions overlapping those of FIG. 3 will be omitted.

As shown in FIG. 12, a cross section of a glass fiber 101 of a quantum dot unit 150 according to the sixth embodiment may be a quadrangle. However, a cross-sectional shape of the glass fiber 101 is not limited to the quadrangle.

FIG. 13 is a view showing a quantum dot sheet according to the first embodiment that can be applied to a display device according to an exemplary embodiment.

As shown in FIG. 13, the display device 1 may further include a quantum dot sheet 200. In other words, the display device 1 may further include the quantum dot sheet 200 having a sheet shape and containing the plurality of quantum dot units 100 according to the first embodiment. Here, the quantum dot sheet 200 may contain at least one of the plurality of quantum dot units 100 according to the first embodiment and the plurality of quantum dot units 140 according to the fifth embodiment.

The quantum dot sheet 200 may be implemented by dividing the plurality of quantum dot units 100 according to the first embodiment and then dispersing the plurality of divided quantum dot units 100 according to the first embodiment in a resin 210. The quantum dot sheet 200 may be implemented through an extrusion process.

Figure 14:
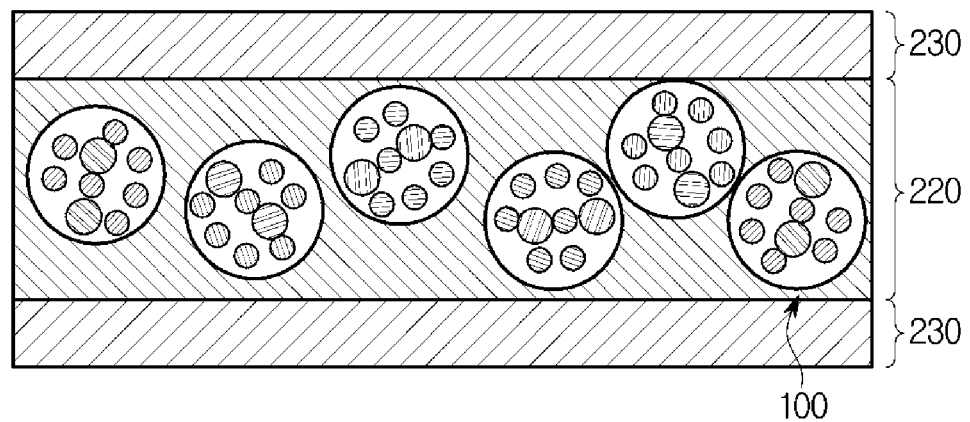
FIG. 14 is a view showing a quantum dot sheet according to the second embodiment that can be applied to a display device according to an exemplary embodiment.

FIG. 14 is a view showing a quantum dot sheet according to the second embodiment that can be applied to a display device according to an exemplary embodiment.

As shown in FIG. 14, the display device 1 may include a quantum dot sheet 200a. In other words, the display device 1 may include the quantum dot sheet 200a having a sheet shape and containing the plurality of quantum dot units 100 according to the first embodiment. Here, the quantum dot sheet 200a may contain at least one of the plurality of quantum dot units 100 according to the first embodiment and the plurality of quantum dot units 140 according to the fifth embodiment.

The quantum dot sheet 200a according to the second embodiment may include a quantum dot containing layer 220 containing at least one of the plurality of quantum dot units 100 according to the first embodiment and the plurality of quantum dot units 140 according to the fifth embodiment.

The quantum dot containing layer 220 may be implemented in the same manner as the quantum dot sheet 200 according to the first embodiment described in FIG. 13.

The quantum dot sheet 200a according to the second embodiment may further include a protective layer 230 that is stacked on at least one surface of the quantum dot containing layer 220. The protective layer 230 may be coated on the at least one surface of the quantum dot containing layer 220. Preferably, the protective layer 230 may be coated on front and rear surfaces of the quantum dot containing layer 220. The protective layer 230 may include PET.

Figure 15:
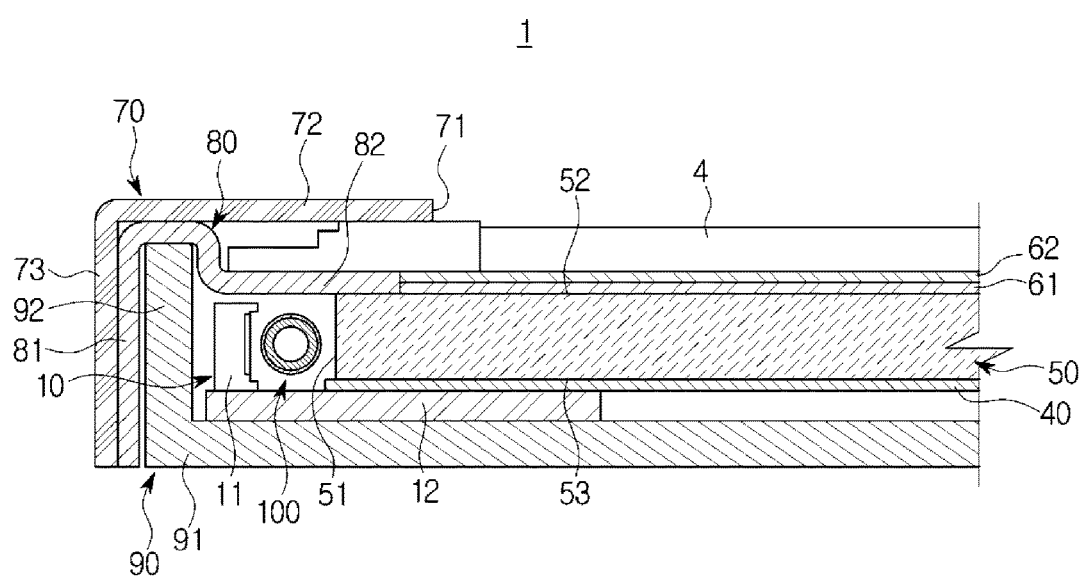
FIG. 15 is a view showing a structure in which the quantum dot unit according to the first embodiment of FIG. 3 is disposed in a display device according to an exemplary embodiment.

FIG. 15 is a view showing a structure in which the quantum dot unit according to the first embodiment of FIG. 3 is disposed in a display device according to an exemplary embodiment.

As shown in FIG. 15, the quantum dot unit 100 according to the first embodiment may be disposed between the light source 11 and the light guide plate 50 to change a wavelength of light emitted from the light source 11.

The light guide plate 50 may include an incident surface 51 on which the light emitted from the light source 11 is incident. In addition, the light guide plate 50 may further include a light emitting surface 52 through which the light incident on the light guide plate 50 is emitted toward the display panel 4. In addition, the light guide plate 50 may further include a rear surface 53 facing the light emitting surface 52 of the light guide plate 50.

The quantum dot unit 100 according to the first embodiment may be disposed between the light source 11 and the incident surface 51 of the light guide plate 50 to change the wavelength of the light emitted from the light source 11.

The quantum dot unit 100 according to the first embodiment may be disposed to be spaced apart from each of the light guide plate 50 and the light source 11.

The light source 11 may emit blue light. The blue light emitted from the light source 11 is converted into white light while passing through the quantum dot unit 100. The white light passed through the quantum dot unit 100 is incident on the incident surface 51 of the light guide plate 50 and is emitted toward the display panel 4 through the light emitting surface 52 of the light guide plate 50.

Figure 16:
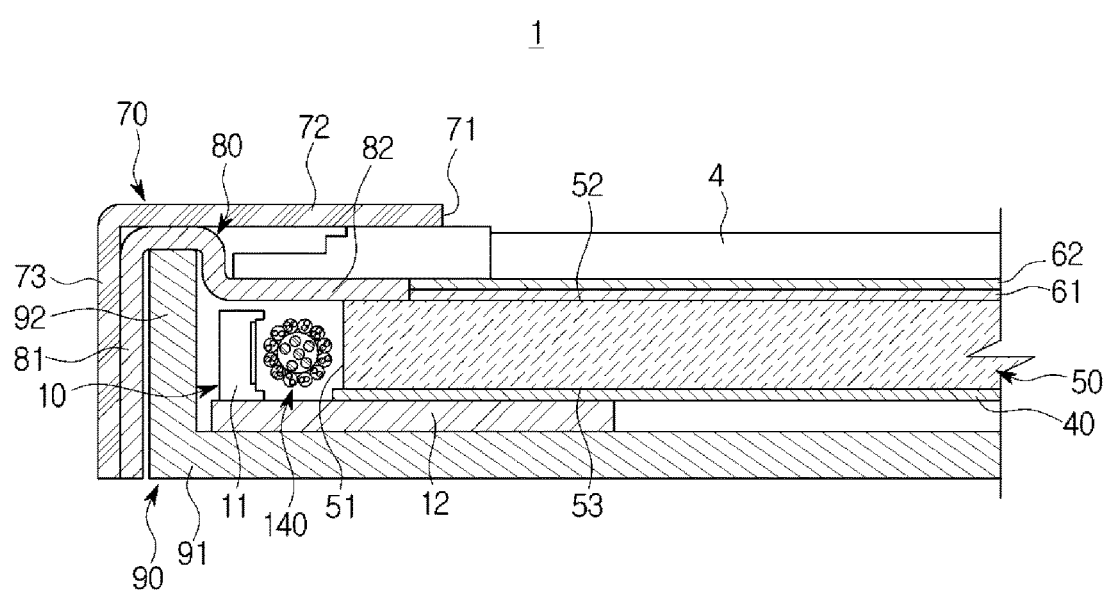
FIG. 16 is a view showing a structure in which the quantum dot unit according to the fifth embodiment of FIG. 11 is disposed in a display device according to an exemplary embodiment.

FIG. 16 is a view showing a structure in which the quantum dot unit according to the fifth embodiment of FIG. 11 is disposed in a display device according to an exemplary embodiment.

As shown in FIG. 16, the quantum dot unit 140 according to the fifth embodiment may be disposed between the light source 11 and the light guide plate 50 to change a wavelength of light emitted from the light source 11.

The light guide plate 50 may include the incident surface 51 on which the light emitted from the light source 11 is incident. In addition, the light guide plate 50 may further include the light emitting surface 52 through which the light incident on the light guide plate 50 is emitted toward the display panel 4.

The quantum dot unit 140 according to the fifth embodiment may be disposed between the light source 11 and the incident surface 51 of the light guide plate 50 to change the wavelength of the light emitted from the light source 11.

The quantum dot unit 140 according to the fifth embodiment may be disposed to be spaced apart from each of the light guide plate 50 and the light source 11.

The light source 11 may emit blue light. The blue light emitted from the light source 11 is converted into white light while passing through the quantum dot unit 140. The white light passed through the quantum dot unit 140 is incident on the incident surface 51 of the light guide plate 50 and is emitted toward the display panel 4 through the light emitting surface 52 of the light guide plate 50.

Figure 17:
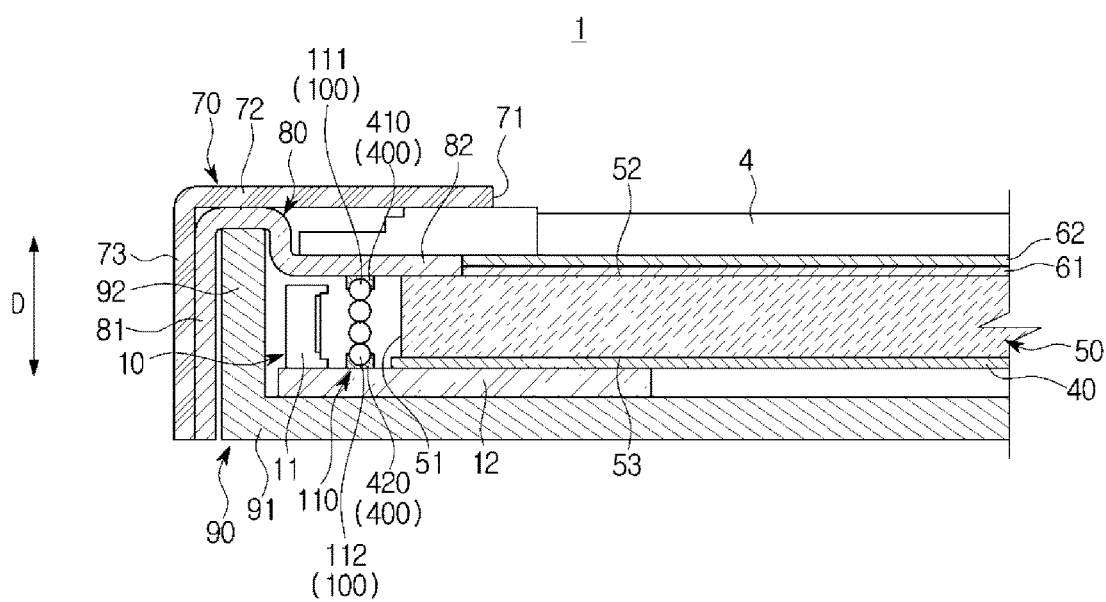
FIG. 17 is a view showing a structure in which the quantum dot unit according to the second embodiment of FIG. 8 is disposed in a display device according to an exemplary embodiment.

FIG. 17 is a view showing a structure in which the quantum dot unit according to the second embodiment of FIG. 8 is disposed in a display device according to an exemplary embodiment.

As shown in FIG. 17, the quantum dot unit 110 according to the second embodiment may be disposed between the light source 11 and the light guide plate 50 to change a wavelength of light emitted from the light source 11. At this time, the quantum dot unit 110 according to the second embodiment may have a structure in which the plurality of quantum dot units 110 according to the first embodiment are stacked and arranged in a thickness direction D of the light guide plate 50.

The light guide plate 50 may include the incident surface 51 on which the light emitted from the light source 11 is incident. In addition, the light guide plate 50 may further include the light emitting surface 52 through which the light incident on the light guide plate 50 is emitted toward the display panel 4.

The quantum dot unit 110 according to the second embodiment may be disposed between the light source 11 and the incident surface 51 of the light guide plate 50 to change the wavelength of the light emitted from the light source 11.

The quantum dot unit 110 according to the second embodiment may be disposed to be spaced apart from each of the light guide plate 50 and the light source 11.

The light source 11 may emit blue light. The blue light emitted from the light source 11 is converted into white light while passing through the quantum dot unit 110. The white light passed through the quantum dot unit 110 is incident on the incident surface 51 of the light guide plate 50 and is emitted toward the display panel 4 through the light emitting surface 52 of the light guide plate 50.

The display device 1 may include the PCB 12 on which the light source 11 is mounted and which is disposed behind the light guide plate 50 in the thickness direction D of the light guide plate 50.

The display device 1 may further include the middle mold 80 provided to support the display panel 4. The middle mold 80 includes the intermediate support portion 82 disposed in front of the light guide plate 50 in the thickness direction D of the light guide plate 50 to face the PCB 12 with the light source 11 interposed therebetween.

The display device 1 may further include a fixing member 400. The fixing member 400 may include a first fixing member 410 provided on the intermediate support portion 82 so that a first quantum dot unit 111 facing the intermediate support portion 82 of the plurality of quantum dot units 100 is fixed to the first fixing member 410. The fixing member 400 may further include a second fixing member 420 provided on the PCB 12 so that a second quantum dot unit 112 facing the PCB 12 among the plurality of quantum dot units 100 is fixed to the second fixing member 420.

Figure 18:
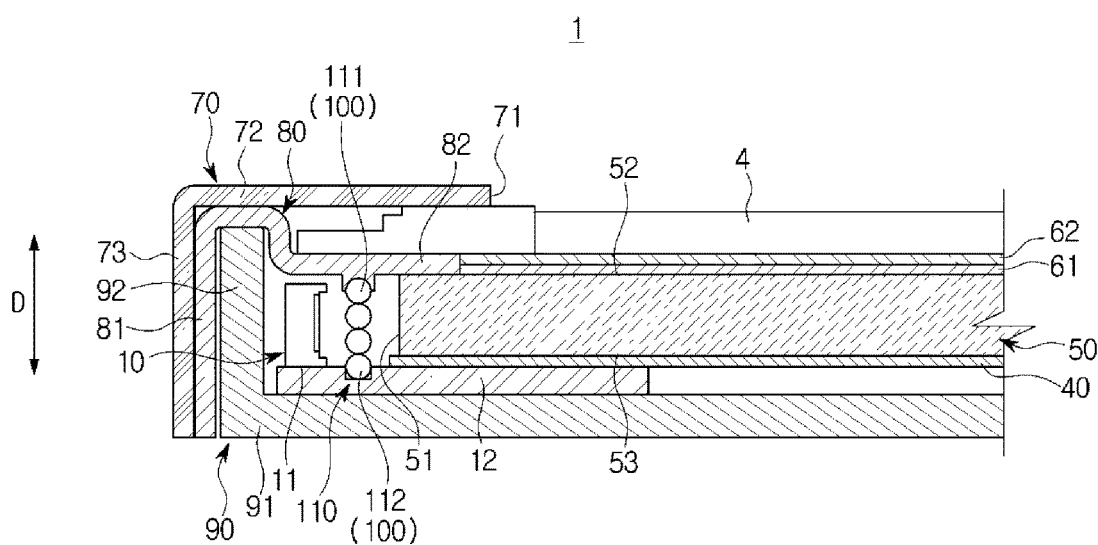
FIG. 18 is a view showing a structure in which the quantum dot unit according to the second embodiment of FIG. 8 is disposed in a display device according to an exemplary embodiment in a way different from that of FIG. 17.

FIG. 18 is a view showing a structure in which the quantum dot unit according to the second embodiment of FIG. 8 is disposed differently from FIG. 17 in a display device according to an exemplary embodiment. Hereinafter, descriptions overlapping those of FIG. 17 will be omitted.

As shown in FIG. 18, at least one of the plurality of quantum dot units 100 may be fixed to at least one of the PCB 12 and the intermediate support portion 82. Preferably, the first quantum dot unit 111 of the plurality of quantum dot units 100 facing the intermediate support portion 82 may be fixed to the intermediate support portion 82, and the second quantum dot unit 112 of the plurality of quantum dot units 100 facing the PCB 12 may be fixed to the PCB 12.

That is, when the quantum dot unit 110 according to the second embodiment is disposed as shown in FIG. 18, the separate fixing member 400 described in FIG. 17 may be omitted.

Figure 19:
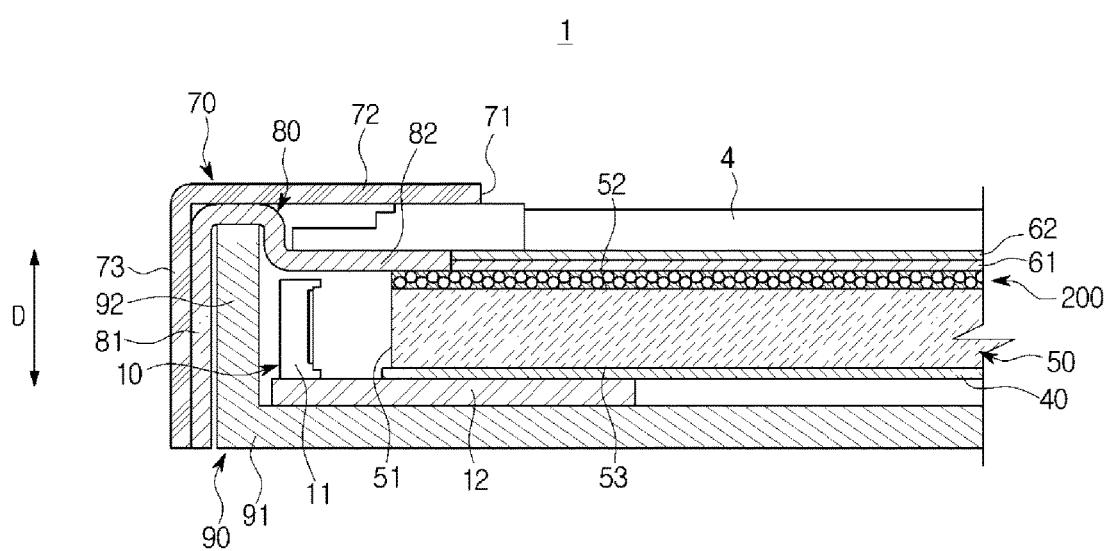
FIG. 19 is a view showing a structure in which the quantum dot sheet according to the first embodiment of FIG. 13 is disposed in front of a light guide plate in a display device according to an exemplary embodiment.

FIG. 19 is a view showing a structure in which the quantum dot sheet according to the first embodiment of FIG. 13 is disposed in front of a light guide plate in a display device according to an exemplary embodiment.

As shown in FIG. 19, the quantum dot sheet 200 according to the first embodiment may be disposed in front of the light guide plate 50.

The display device 1 may include the optical sheets 61 and 62 disposed in front of the light guide plate 50 in the thickness direction D of the light guide plate 50 to improve the optical characteristics of the light emitted from the light guide plate 50. The quantum dot sheet 200 may be disposed between the light guide plate 50 and the optical sheets 61 and 62.

The light source 11 may emit blue light. The blue light emitted from the light source 11 is incident on the incident surface 51 of the light guide plate 50 and then emitted to the quantum dot sheet 200 through the light emitting surface 52 of the light guide plate 50. The blue light is converted into white light while passing through the quantum dot sheet 200. The white light passed through the quantum dot sheet 200 is emitted toward the display panel 4 via the optical sheets 61 and 62.

Figure 20:
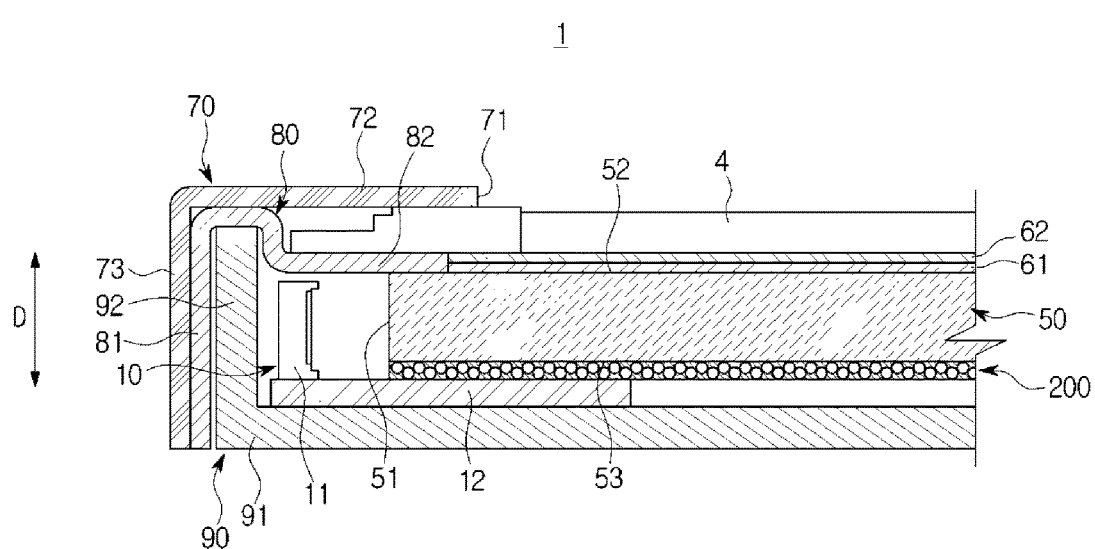
FIG. 20 is a view showing a structure in which the quantum dot sheet according to the first embodiment of FIG.

FIG. 20 is a view showing a structure in which the quantum dot sheet according to the first embodiment of FIG. 13 is disposed behind a light guide plate in a display device according to an exemplary embodiment.

As shown in FIG. 20, the quantum dot sheet 200 according to the first embodiment may be disposed behind the light guide plate 50.

The display device 1 may include the PCB 12 on which the light source 11 is mounted and which is disposed behind the light guide plate 50 in the thickness direction D of the light guide plate 50. The quantum dot sheet 200 may be disposed between the light guide plate 50 and the PCB 12. Here, the quantum dot sheet 200 according to the first embodiment may also serve as the reflective sheet 40. In other words, the quantum dot sheet 200 according to the first embodiment not only converts blue light into white light (color conversion), but also serves as the reflective sheet 40.

The light source 11 may emit blue light. The blue light emitted from the light source 11 is incident on the incident surface 51 of the light guide plate 50. A part of the light incident on the light guide plate 50 may be irregularly reflected on the rear surface 53 of the light guide plate 50. The irregularly reflected light on the rear surface 53 of the light guide plate 50 is converted into white light by the quantum dot sheet 200, and then totally reflected on the rear surface 53 of the light guide plate 50 again by the quantum dot sheet 200 also serving as the reflective sheet 40. The light totally reflected on the rear surface 53 of the light guide plate 50 is emitted toward the display panel 4 through the light emitting surface 52 of the light guide plate 50.

FIG. 21 is a view showing a structure in which the quantum dot sheet according to the first embodiment of FIG. 13 is disposed on a lateral side of a light guide plate in a display device according to an exemplary embodiment.

As shown in FIG. 21, the quantum dot sheet 200 according to the first embodiment may be disposed on a lateral side of the light guide plate 50. That is, the quantum dot sheet 200 according to the first embodiment may be disposed between the incident surface 51 of the light guide plate 50 and the light source 11. At this time, the quantum dot sheet 200 may be attached to the incident surface 51 of the light guide plate 50.

The light source 11 may emit blue light. The blue light emitted from the light source 11 is converted into white light while passing through the quantum dot sheet 200. The white light passed through the quantum dot sheet 200 is incident on the incident surface 51 of the light guide plate 50 and is emitted toward the display panel 4 through the light emitting surface 52 of the light guide plate 50.

FIG. 22 is a cross-sectional view showing a display device according to another exemplary embodiment. Hereinafter, descriptions overlapping those of FIGS. 1 to 3 will be omitted.

As shown in FIG. 22, a light guide plate 50*a* may include the plurality of quantum dot units 100 according to the first embodiment. In other words, in a process of forming the light guide plate 50*a*, the plurality of the quantum dot units 100 according to the first embodiment may be included. The light guide plate 50*a* may include the plurality of the quantum dot units 140 according to the fifth embodiment as well as the plurality of quantum dot units 100 according to the first embodiment. That is, the light guide plate 50*a* may include at least one of the plurality of quantum dot units 100 according to the first embodiment and the plurality of quantum dot units 140 according to the fifth embodiment.

The light source 11 may emit blue light. The blue light emitted from the light source 11 is incident on the incident surface 51 of the light guide plate 50*a*. The light incident on the light guide plate 50*a* is converted into white light by at least one of the plurality of quantum dot units 100 according to the first embodiment and the plurality of quantum dot units 140 according to the fifth embodiment which are included in the light guide plate 50*a* and then is emitted to the display panel 4 through the light emitting surface 52 of the light guide plate 50*a*.

FIG. 23 is a cross-sectional view showing a display device according to still another exemplary embodiment. Hereinafter, descriptions overlapping those of FIGS. 1 to 3 and FIG. 10 will be omitted.

As shown in FIG. 23, the display device 1 may include a plurality of light guide plates 50. The plurality of light guide plates 50 may be mounted on the PCB 12 to be spaced apart from each other. For example, the plurality of light guide plates 50 may include a first light guide plate 54 mounted on the right side of the PCB 12 and a second light guide plate 55 mounted on the left side of the PCB 12.

The display device 1 may further include the light source 11 disposed between the plurality of light guide plates 50. The light source 11 may be disposed between the plurality of light guide plates 50 to supply or emit light toward the plurality of light guide plates 50. The light source 11 may be mounted on the PCB 12 to be positioned between the plurality of light guide plates 50.

The display device 1 may further include a plurality of quantum dot units 130 according to the fourth embodiment. For example, the plurality of quantum dot units 130 according to the fourth embodiment may include a first quantum dot unit 131 disposed between the first light guide plate 54 and the light source 11 and a second quantum dot unit 132 disposed between the second light guide plate 55 and the light source 11.

A portion of the first quantum dot unit 131 facing the first light guide plate 54 may be surrounded by the adhesive member 300. In other words, the first quantum dot unit 131 may be disposed between the first light guide plate 54 and the light source 11 such that the adhesive member 300 faces the first light guide plate 54. A portion of the second quantum dot unit 132 facing the second light guide plate 55 may be surrounded by the adhesive member 300. In other words, the second quantum dot unit 132 may be disposed between the second light guide plate 55 and the light source 11 such that the adhesive member 300 faces the second light guide plate 55.

The light source 11 may emit blue light. A part of the blue light emitted from the light source 11 is converted into white light while passing through the first quantum dot unit 131. The white light passed through the first quantum dot unit 131 is incident on the incident surface 51 of the first light guide plate 54 and is emitted to the display panel 4 through the light emitting surface 52 of the first light guide plate 54. The other part of the blue light emitted from the light source 11 is converted into white light while passing through the second quantum dot unit 132. The white light passed through the second quantum dot unit 132 is incident on the incident surface 51 of the second light guide plate 55 and is emitted toward the display panel 4 through the light emitting surface 52 of the second light guide plate 55.

FIG. 24 is an exploded perspective view showing a display device according to yet another exemplary embodiment.

As shown in FIG. 24, a display device 1*a* may further include a display module 1000 in which an image is displayed. The display module 1000 will be described in detail later.

The display device 1*a* may further include a case 2000 that forms an appearance thereof.

The case 2000 may include a front case 2100 and a rear case 2200 that are coupled to each other to accommodate the display module 1000 therein.

The case 2000 may be provided with various terminals for providing connection with various external devices. In addition, a button, a switch, or the like capable of receiving an operation command from a user may be provided. As an example, FIG. 24 shows an operation command input button 2500 provided at the front case 2100.

The display device 1*a* may further include a control board 3000 provided to transmit power and signals to the display module 1000. The control board 3000 may be disposed inside the case 2000. Specifically, the control board 3000 may be disposed between the display module 1000 and the rear case 2200.

FIG. 25 is an exploded perspective view of a display module in the display device of FIG. 24, and FIG. 26 is a cross-sectional view of the display module in the display device of FIG. 24.

As shown in FIGS. 25 and 26, the display module 1000 may include a front chassis 1100 provided on a front surface of the display device 1a, a rear chassis 1200 provided on a rear surface of the display device 1a, and a mold frame 1300 provided inside the display device 1a.

The front chassis 1100 is provided on the same surface as a display panel 5000 on which an image is displayed such that an edge portion of the display panel 5000 is not exposed to the outside. The front chassis 1100 may include a bezel portion 1100a that covers a front edge of the display panel 5000 and a front side surface portion 1100b that is bent rearward from an edge of the bezel portion 1100a.

The rear chassis 1200 may be provided on a surface opposite the display panel 5000. In addition, the rear chassis 1200 may prevent various components included in the display device 1a from being exposed to the outside and may protect the various components included in the display device 1a from external shocks. A BLU 4000 may be mounted on the rear chassis 1200. The rear chassis 1200 may include a rear surface portion 1200a on which the BLU 4000 is mounted and a side surface portion 1200b which extends frontward from an edge of the rear surface portion 1200a. As shown in FIG. 26, the rear surface portion 1200a may be provided with a seating groove 1200c formed in a concave shape so that a circuit board 4300 of the BLU 4000 is seated on the seating groove 1200c.

The mold frame 1300 may be provided to support the display panel 5000 and a light diffusion plate 7000. The mold frame 1300 may support the display panel 5000 disposed in front of the mold frame 1300 and the light diffusion plate 7000 disposed behind the mold frame 1300. The front chassis 1100 may be provided in front of the mold frame 1300 such that the display panel 5000 is maintained in a state of being provided on the mold frame 1300. The rear chassis 1200 may be provided behind the mold frame 1300.

The display module 1000 may include the display panel 5000. Description of the display panel 5000 will be omitted because it is the same as that of the display panel 4 of FIGS. 1 and 2.

The display module 1000 may further include the BLU 4000 that supplies light to the display panel 5000. The BLU 4000 may be disposed behind the display panel 5000 to be spaced apart therefrom.

The BLU 4000 may include a plurality of light sources 4100 that generate light. The plurality of light sources 4100 are elements that emit light. The plurality of light sources 4100 may be provided on a front surface of the circuit board 4300 to face the light diffusion plate 7000. In addition, the plurality of light sources 4100 may radiate light toward the display panel 5000.

In addition, the BLU 4000 may further include a plurality of lenses 4200 that respectively surround the plurality of light sources 4100. The plurality of lenses 4200 may diffuse the light generated by the plurality of light sources 4100. Each of the plurality of lenses 4200 may have a circular shape, but the shapes of the plurality of lenses 4200 may be variously modified. The plurality of lenses 4200 may be implemented by using a resin material having light transmittance. As an example, the plurality of lenses 4200 may be implemented with polycarbonate (PC), PMMA, an acrylic, or the like. The implementation material of the plurality of lenses 4200 is not limited to the above examples, and the plurality of lenses 4200 may be implemented by using various materials such as glass materials.

In addition, the BLU 4000 may further include the circuit board 4300 on which the plurality of light sources 4100 are mounted. The circuit board 4300 may include at least one of a PCB and a flexible circuit board (flexible copper clad laminate).

The circuit board 4300 may be disposed in the rear chassis 1200. The circuit board 4300 may be elongated to have a length in one direction to correspond to the display panel 5000, as shown in FIG. 25. A conductive pattern may be formed on the circuit board 4300. The plurality of light sources 4100 and the circuit board 4300 may be electrically connected through a method such as wire bonding or flip chip bonding.

The BLU 4000 may include a plurality of circuit boards 4300 arranged in parallel to each other to be spaced apart from each other. In each of the plurality of circuit boards 4300, the plurality of light sources 4100 and the plurality of lenses 4200 respectively provided the plurality of light sources 4100 may be spaced apart from each other in a longitudinal direction of the plurality of circuit boards 4300. The plurality of circuit boards 4300 may be connected to each other through a connection board 4400.

In addition, the BLU 4000 may further include the quantum dot sheet 200 that receives light radiated from the plurality of light sources 4100 and outputs white light (light in which light of various colors is mixed). Here, a description of the quantum dot sheet 200 will be omitted because it overlaps that of the quantum dot sheet 200 according to the first embodiment of FIG. 13. An arrangement structure of the quantum dot sheet 200 will be described later.

The display module 1000 may further include the light diffusion plate 7000 that is provided to diffuse the light radiated from the BLU 4000 and to transmit the light to the display panel 5000. In other words, the light diffusion plate 7000 may be disposed between the display panel 5000 and the plurality of light sources 4100 to diffuse the light radiated from the plurality of light sources 4100 and guide the light to the display panel 5000. The light diffusion plate 7000 may be disposed behind the display panel 5000.

The display module 1000 may further include an optical sheet 6000 disposed on a front surface of the light diffusion plate 7000 to improve optical characteristics of the light emitted from the plurality of light sources 4100. The optical sheet 6000 may be disposed in front of the plurality of light sources 4100. The optical sheet 6000 may include a prism film 6100 that may condense light diffused by the light diffusion plate 7000 in a direction perpendicular to the display panel 5000. The optical sheet 6000 may further include a protective film 6200 for protecting the prism film 6100. The protective film 6200 may be provided on a front surface of the prism film 6100. The protective film 6200 protects various components included in the BLU 4000 from external shocks or a foreign substance inflow. In particular, since scratches tend to occur on the prism film 6100, the protective film 6200 is provided on the front surface of the prism film 6100 to prevent the occurrence of scratches on the prism film 6100. The optical sheet 6000 may further include a DBEF (not shown). The DBEF may be disposed on a front surface of the protective film 6200. The DBEF is a kind of polarizing film and is also referred to as a reflective type polarizing film. Such a DBEF may transmit light polarized in a direction parallel to a polarization direction of the DBEF among the light radiated from the BLU 4000, and may reflect light polarized in a direction different from the polarization direction of the DBEF. Here, the reflected light is recycled inside the BLU 4000 to improve brightness of the display device 1a.

Hereinafter, the arrangement structure of the quantum dot sheet 200 will be described.

The quantum dot sheet 200 may be disposed adjacent to the optical sheet 6000 to convert a wavelength of the light emitted from the plurality of light sources 4100. Specifically, the quantum dot sheet 200 may be disposed between the optical sheet 6000 and the light diffusion plate 7000 to change the wavelength of the light emitted from the plurality of light sources 4100. More specifically, the quantum dot sheet 200 may be disposed between the prism film 6100 and the light diffusion plate 7000.

As described above, excellent color reproducibility can be realized at a reasonable production cost by using a glass fiber and a quantum dot unit including quantum dots accommodated in a hollow portion of the glass fiber instead of using a high-priced barrier film.

In addition, a display device having a slim design can be realized by employing a quantum dot sheet also serving as a reflective sheet or a light guide plate.

Although a few exemplary embodiments of the present disclosure have been shown and described, it should be appreciated by those skilled in the art that changes may be made in these exemplary embodiments without departing from the principles and spirit of the disclosure, the scope of which is defined in the claims and their equivalents.

What is claimed is:
1. A display device comprising:
a display panel configured to display an image;
a light source configured to emit light;
a light guide plate configured to guide the light emitted from the light source to the display panel; and
a quantum dot unit disposed between the light source and the light guide plate and having ductility,
wherein the quantum dot unit is configured to change a wavelength of the light emitted from the light source,
wherein the quantum dot unit comprises a glass fiber having a hollow portion, a quantum dot disposed in the hollow portion, and a protective membrane configured to surround an entire outer circumferential surface of the glass fiber in contact with the entire outer circumferential surface of the glass fiber, and
wherein the quantum dot unit is configured such that the light emitted from the light source passes through the protective membrane and the glass fiber to reach the quantum dot disposed in the hollow portion.
2. The display device of claim 1, wherein the protective membrane comprises at least one from among an acrylic resin, a silicone resin, and an epoxy resin.
3. The display device of claim 1, wherein the light guide plate comprises an incident surface on which the light emitted from the light source is incident, and
wherein the quantum dot unit is disposed between the incident surface and the light source.
4. The display device of claim 3, wherein the quantum dot unit is spaced apart from each of the light guide plate and the light source.
5. The display device of claim 1, wherein the quantum dot unit further comprises a plurality of quantum dot units arranged in a thickness direction of the light guide plate.
6. The display device of claim 5, wherein the plurality of quantum dot units adhere to each other by an adhesive member.
7. The display device of claim 6, wherein the adhesive member comprises at least one from among an acrylic resin, a silicone resin, and an epoxy resin.
8. The display device of claim 5, further comprising:
a printed circuit board (PCB) disposed behind the light guide plate in the thickness direction of the light guide plate, the light source being mounted on the PCB;
a middle mold provided to support the display panel, wherein the middle mold comprises an intermediate support portion disposed in front of the light guide plate in the thickness direction of the light guide plate to face the PCB with the light source interposed therebetween; and
a fixing member comprising a first fixing member attached to the intermediate support portion such that a first quantum dot unit of the plurality of quantum dot units facing the intermediate support portion is fixed to the first fixing member, and a second fixing member attached to the PCB such that a second quantum dot unit of the plurality of quantum dot units facing the PCB is fixed to the second fixing member.
9. The display device of claim 5, further comprising:
a printed circuit board (PCB) disposed behind the light guide plate in the thickness direction of the light guide plate, the light source being mounted on the PCB; and
a middle mold provided to support the display panel, wherein the middle mold comprises an intermediate support portion disposed in front of the light guide plate in the thickness direction of the light guide plate to face the PCB with the light source interposed therebetween,
wherein at least one of the plurality of quantum dot units is fixed to at least one of the PCB and the intermediate support portion.
10. The display device of claim 1, wherein the quantum dot unit further comprises:
a first quantum dot unit comprising a first quantum dot configured to emit light of a first color, and
a plurality of second quantum dot units comprising a second quantum dot configured to emit light of a second color, the second color being different from the first color, the plurality of second quantum dot units being disposed along an outer periphery of the first quantum dot unit.
11. The display device of claim 1, wherein the quantum dot unit further comprises a quantum dot sheet, wherein the quantum dot sheet comprises a plurality of quantum dot units.
12. The display device of claim 1,
wherein a ratio of a diameter of the hollow portion to a diameter of the quantum dot unit including the protective membrane is 0.5 or larger and 0.95 or smaller.
13. A display device comprising:
a display panel configured to display an image;
a light source configured to emit light;
an optical sheet disposed in front of the light source; and
a quantum dot sheet disposed adjacent to the optical sheet, the quantum dot sheet being configured to convert a wavelength of the light emitted from the light source to another wavelength, the quantum dot sheet comprising a quantum dot unit having ductility, wherein the quantum dot unit comprises a glass fiber having a hollow portion, a quantum dot disposed in the hollow portion, and a protective membrane configured to surround an entire outer circumferential surface of the glass fiber in contact with the entire outer circumferential surface of the glass fiber, wherein the quantum dot unit is configured such that the light emitted from the light source passes through the protective membrane and the glass fiber to reach the quantum dot disposed in the hollow portion.

14. The display device of claim 13, wherein the protective membrane comprises at least one from among an acrylic resin, a silicone resin, and an epoxy resin.

15. The display device of claim 13, further comprising:
a light diffusion plate disposed between the display panel and the light source, the light diffusion plate being configured to diffuse the light emitted from the light source and guide the diffused light to the display panel,
wherein the quantum dot sheet is disposed between the optical sheet and the light diffusion plate.

16. A quantum dot unit comprising:
a tube-shaped glass fiber having ductility and a hollow portion;
a quantum dot accommodated in the hollow portion; and
a protective membrane configured to surround an entire outer circumferential surface of the glass fiber in contact with the entire outer circumferential surface of the glass fiber,
wherein the quantum dot unit is configured such that light emitted from a light source passes through the protective membrane and the glass fiber to reach the quantum dot disposed in the hollow portion.

17. A quantum dot sheet comprising:
a layer comprising a plurality of quantum dot units, each of the plurality of quantum dot units comprising:
a tube-shaped glass fiber having ductility and a hollow portion;
a quantum dot disposed in the hollow portion; and
a protective membrane configured to surround an entire outer circumferential surface of the glass fiber in contact with the entire outer circumferential surface of the glass fiber,
wherein the plurality of quantum dot units are configured such that light emitted from a light source passes through the protective membrane and the glass fiber to reach the quantum dot disposed in the hollow portion.

18. The quantum dot sheet of claim 17, further comprising:
a protective layer stacked on at least one surface of the layer,
wherein the protective layer comprises polyethylene terephthalate (PET).

19. A display device comprising:
a display panel configured to display an image;
a light source configured to emit light; and
a light guide plate configured to guide the light emitted from the light source to the display panel,
wherein the light guide plate comprises a quantum dot unit, the quantum dot unit being configured to change a wavelength of the light emitted from the light source,
wherein the quantum dot unit comprises a glass fiber having a hollow portion, a quantum dot disposed in the hollow portion, and a protective membrane configured to surround an entire outer circumferential surface of the glass fiber in contact with the entire outer circumferential surface of the glass fiber, and
wherein the quantum dot unit is configured such that the light emitted from the light source passes through the protective membrane and the glass fiber to reach the quantum dot disposed in the hollow portion.

20. The display device of claim 19,
wherein the quantum dot unit is disposed inside the light guide plate, and
wherein the quantum dot unit is configured to change a wavelength of light entering the light guide plate.

* * * * *